US011283023B2

(12) United States Patent
He et al.

(10) Patent No.: US 11,283,023 B2
(45) Date of Patent: Mar. 22, 2022

(54) DOPING OF OTHER POLYMERS INTO ORGANIC SEMI-CONDUCTING POLYMERS

(71) Applicant: Corning Incorporated, Corning, NY (US)

(72) Inventors: Mingqian He, Horseheads, NY (US); Yang Li, Shanghai (CN); James Robert Matthews, Painted Post, NY (US); Karan Mehrotra, Painted Post, NY (US); Weijun Niu, Painted Post, NY (US); Arthur Lawrence Wallace, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 74 days.

(21) Appl. No.: 16/620,050

(22) PCT Filed: Jun. 1, 2018

(86) PCT No.: PCT/US2018/035700
§ 371 (c)(1),
(2) Date: Dec. 6, 2019

(87) PCT Pub. No.: WO2018/226536
PCT Pub. Date: Dec. 13, 2018

(65) Prior Publication Data
US 2020/0212304 A1 Jul. 2, 2020

Related U.S. Application Data

(60) Provisional application No. 62/516,943, filed on Jun. 8, 2017.

(51) Int. Cl.
*H01L 51/00* (2006.01)
*C08G 61/12* (2006.01)
*H01L 51/05* (2006.01)

(52) U.S. Cl.
CPC ........ *H01L 51/0036* (2013.01); *C08G 61/126* (2013.01); *H01L 51/004* (2013.01);
(Continued)

(58) Field of Classification Search
CPC .. H01L 51/0036; H01L 51/004; C08G 61/126
See application file for complete search history.

(56) References Cited

U.S. PATENT DOCUMENTS 6,800,330 B2  10/2004  Hayashi et al.
7,186,358 B2   3/2007  McCulloch et al.
(Continued)

FOREIGN PATENT DOCUMENTS

CN  101689607 A  3/2010
CN  102017209 A  4/2011
(Continued)

OTHER PUBLICATIONS

Yun et al; "Conformation-Insensitive Ambipolar Charge Transport in a Diketopyrrolopyrrole-Based Co-Polymer Containing Acetylene Linkages"; Chem. Mater. 2014, 26 (13), pp. 39283937.
(Continued)

*Primary Examiner* — Catherine S Branch

(57) ABSTRACT

Disclosed is a polymer blend comprising an organic semiconductor (OSC) polymer blended with an isolating polymer and method for making the same. The OSC polymer includes a diketopyrrolopyrrole fused thiophene polymeric material, and the fused thiophene is beta-substituted. The isolating polymer includes a non-conjugated backbone, and the isolating polymer may be one of polyacrylonitrile, alkyl substituted polyacrylonitrile, polystyrene, polysulfonate, polycarbonate, an elastomer block copolymer, derivatives thereof, copolymers thereof and mixtures thereof. The method includes blending the OSC polymer with an isolating polymer in an organic solvent to create a polymer blend
(Continued)

and depositing a thin film of the polymer blend over a substrate. Also disclosed is an organic semiconductor device that includes a thin semiconducting film comprising OSC polymer.

22 Claims, 2 Drawing Sheets

(52) U.S. Cl.
CPC ............... C08G 2261/124 (2013.01); C08G 2261/1412 (2013.01); C08G 2261/3241 (2013.01); C08G 2261/3243 (2013.01); C08G 2261/92 (2013.01); H01L 51/0007 (2013.01); H01L 51/0028 (2013.01); H01L 51/0566 (2013.01)

(56) References Cited

U.S. PATENT DOCUMENTS

| | | | |
|---|---|---|---|
| 7,705,108 B2 | 4/2010 | He | |
| 7,838,623 B2 | 11/2010 | He | |
| 7,935,960 B2 | 5/2011 | Anemian et al. | |
| 7,985,353 B2 | 7/2011 | Leeming et al. | |
| 8,232,550 B2 | 7/2012 | Clough et al. | |
| 8,487,114 B2 | 7/2013 | He et al. | |
| 8,691,621 B1 | 4/2014 | Ulmer et al. | |
| 8,692,236 B2 | 4/2014 | Cho et al. | |
| 8,735,871 B2 | 5/2014 | Halls et al. | |
| 8,758,649 B2 | 6/2014 | James et al. | |
| 8,828,793 B2 | 9/2014 | Cho et al. | |
| 9,159,926 B2 | 10/2015 | Newsome | |
| 9,178,160 B1 | 11/2015 | Facchetti et al. | |
| 9,178,166 B2 | 11/2015 | Waller et al. | |
| 9,212,260 B2 | 12/2015 | Blouin et al. | |
| 9,368,737 B2 | 6/2016 | Hwang et al. | |
| 9,455,059 B2 | 9/2016 | Blouin et al. | |
| 9,580,556 B2 | 2/2017 | He et al. | |
| 9,620,716 B2 | 4/2017 | Wang et al. | |
| 9,761,805 B2 | 9/2017 | Wang et al. | |
| 10,050,201 B2 | 8/2018 | Tierney et al. | |
| 10,340,457 B2 | 7/2019 | D'Lavari et al. | |
| 10,367,143 B2 | 7/2019 | Nanson et al. | |
| 10,547,004 B2 | 1/2020 | Mitchell et al. | |
| 2004/0178408 A1 | 9/2004 | McCulloch et al. | |
| 2007/0221916 A1 | 9/2007 | Shkunov et al. | |
| 2010/0140600 A1 | 6/2010 | Clough et al. | |
| 2011/0006265 A1 | 1/2011 | James et al. | |
| 2011/0092015 A1 | 4/2011 | Clough et al. | |
| 2011/0127504 A1 | 6/2011 | Halls et al. | |
| 2012/0037891 A1 | 2/2012 | Cho et al. | |
| 2013/0069020 A1 | 3/2013 | May et al. | |
| 2013/0085256 A1 | 4/2013 | He et al. | |
| 2013/0109821 A1 | 5/2013 | He et al. | |
| 2014/0252279 A1 | 9/2014 | Wang et al. | |
| 2014/0339477 A1 | 11/2014 | Waller et al. | |
| 2014/0346407 A1 | 11/2014 | Byrne et al. | |
| 2015/0048279 A1 | 2/2015 | Mitchell et al. | |
| 2015/0048315 A1 | 2/2015 | Ng et al. | |
| 2015/0144846 A1 | 5/2015 | Nanson et al. | |
| 2015/0144847 A1 | 5/2015 | D'Lavari et al. | |
| 2015/0295179 A1 | 10/2015 | Li | |
| 2015/0322208 A1 | 11/2015 | Mitchell et al. | |
| 2015/0349256 A1 | 12/2015 | Mitchell et al. | |
| 2016/0013411 A1 | 1/2016 | Lim et al. | |
| 2016/0133863 A1 | 5/2016 | May et al. | |
| 2016/0155946 A1 | 6/2016 | Blouin et al. | |
| 2016/0222167 A1 | 8/2016 | He et al. | |
| 2016/0272753 A1 | 9/2016 | Nanson et al. | |
| 2016/0276591 A1 | 9/2016 | Mitchell et al. | |
| 2016/0359116 A1 | 12/2016 | Crowley et al. | |
| 2017/0054096 A1 | 2/2017 | Ford et al. | |
| 2017/0148991 A1* | 5/2017 | Duggeli | H01L 51/0035 |
| 2017/0256728 A1 | 9/2017 | Nanson et al. | |
| 2017/0260325 A1 | 9/2017 | Blouin et al. | |
| 2019/0081243 A1* | 3/2019 | Ong | C09D 5/24 |

FOREIGN PATENT DOCUMENTS

| | | |
|---|---|---|
| CN | 103155196 A | 6/2013 |
| CN | 104024263 A | 9/2014 |
| CN | 104105734 A | 10/2014 |
| CN | 104114599 A | 10/2014 |
| CN | 104136484 A | 11/2014 |
| CN | 104583267 A | 4/2015 |
| CN | 104769076 A | 7/2015 |
| CN | 104812795 A | 7/2015 |
| CN | 104885249 A | 9/2015 |
| CN | 105324460 A | 2/2016 |
| CN | 105658761 A | 6/2016 |
| CN | 105765028 A | 7/2016 |
| EP | 2171775 A1 | 4/2010 |
| EP | 2248200 A1 | 11/2010 |
| EP | 2377179 A1 | 10/2011 |
| EP | 2576724 A1 | 4/2013 |
| EP | 2814862 A2 | 12/2014 |
| EP | 2814863 A1 | 12/2014 |
| EP | 2841484 A1 | 3/2015 |
| EP | 2841485 A1 | 3/2015 |
| EP | 2856531 A1 | 4/2015 |
| EP | 2867271 A1 | 5/2015 |
| EP | 2888307 A1 | 7/2015 |
| EP | 2917261 A1 | 9/2015 |
| EP | 2926386 A1 | 10/2015 |
| EP | 2935235 A1 | 10/2015 |
| EP | 3010992 A1 | 4/2016 |
| EP | 3060622 A1 | 8/2016 |
| EP | 3066147 A2 | 9/2016 |
| GB | 2482974 A | 2/2012 |
| GB | 2485127 A | 5/2012 |
| GB | 2491323 A | 11/2012 |
| GB | 2492305 A | 12/2012 |
| GB | 2507023 A | 4/2014 |
| GB | 2516207 A | 1/2015 |
| GB | 2516798 A | 2/2015 |
| GB | 2520464 A | 5/2015 |
| GB | 2530954 A | 4/2016 |
| IN | 201003710 | 11/2011 |
| IN | 201204122 | 6/2013 |
| IN | 201401942 | 12/2014 |
| IN | 2013120591 | 12/2014 |
| IN | 201504395 | 11/2015 |
| JP | 62235279 A | 10/1987 |
| JP | 06053363 A | 2/1994 |
| JP | 10312717 A | 11/1998 |
| JP | 2002-285086 A | 10/2002 |
| JP | 2002285085 A | 10/2002 |
| JP | 2002285087 A | 10/2002 |
| JP | 2004-343051 A | 12/2004 |
| JP | 2007129172 A | 5/2007 |
| JP | 2007-258724 A | 10/2007 |
| JP | 2012094691 A | 5/2012 |
| JP | 5406284 B2 | 2/2014 |
| JP | 2015038210 A | 2/2015 |
| JP | 5745278 B2 | 7/2015 |
| JP | 2015-165022 A | 9/2015 |
| KR | 10-2008-0009751 A | 1/2008 |
| KR | 2008-0003883 A | 1/2008 |
| KR | 10-2008-0024136 A | 3/2008 |
| KR | 2010-0138997 A | 12/2010 |
| KR | 1113166 B1 | 2/2012 |
| KR | 10-2012-0063954 A | 6/2012 |
| KR | 1192095 B1 | 10/2012 |
| KR | 2013-0080802 A | 7/2013 |
| KR | 2013104472 A | 9/2013 |
| KR | 10-1347419 B1 | 2/2014 |
| KR | 10-1376494 B1 | 3/2014 |
| KR | 10-2014-0131818 A | 11/2014 |
| KR | 2014-0135747 A | 11/2014 |
| KR | 2014-0135748 A | 11/2014 |
| KR | 2015-0023515 A | 3/2015 |
| KR | 1508213 B1 | 4/2015 |

(56) References Cited

FOREIGN PATENT DOCUMENTS

| | | | |
|---|---|---|---|
| KR | 2015-0082540 A | 7/2015 | |
| KR | 2015-0093856 A | 8/2015 | |
| KR | 1543665 B1 | 8/2015 | |
| KR | 2015-0112930 A | 10/2015 | |
| KR | 10-1570891 B1 | 11/2015 | |
| KR | 10-2016-0011244 A | 2/2016 | |
| RU | 2012156386 A | 7/2014 | |
| SG | 185680 A1 | 12/2012 | |
| TW | 201026739 A | 7/2010 | |
| TW | 201638140 A | 11/2016 | |
| WO | 2006/031893 A2 | 3/2006 | |
| WO | 2006113205 A2 | 10/2006 | |
| WO | WO-2008001123 A1 * | 1/2008 | ......... H01L 51/0566 |
| WO | 2008/106019 A2 | 9/2008 | |
| WO | 2009/002624 A1 | 12/2008 | |
| WO | 2009/109273 A1 | 9/2009 | |
| WO | 2009/121672 A1 | 10/2009 | |
| WO | 2009/123695 A1 | 10/2009 | |
| WO | 2010030050 A1 | 3/2010 | |
| WO | 2010/071267 A1 | 6/2010 | |
| WO | 2010/071268 A1 | 6/2010 | |
| WO | WO-2010108873 A1 * | 9/2010 | ......... H01L 51/0043 |
| WO | 2011/147523 A1 | 12/2011 | |
| WO | 2012/081648 A1 | 6/2012 | |
| WO | 2013/052153 A1 | 4/2013 | |
| WO | 2013/120590 A1 | 8/2013 | |
| WO | 2013/120591 A2 | 8/2013 | |
| WO | 2013/159862 A1 | 10/2013 | |
| WO | 2013/159863 A1 | 10/2013 | |
| WO | 2013/182262 A1 | 12/2013 | |
| WO | 2014/005667 A1 | 1/2014 | |
| WO | 2014/029453 A1 | 2/2014 | |
| WO | 2014/071524 A1 | 5/2014 | |
| WO | 2014/083328 A1 | 6/2014 | |
| WO | 2014094954 A1 | 6/2014 | |
| WO | 2014/202184 A1 | 12/2014 | |
| WO | 2015/005667 A1 | 1/2015 | |
| WO | 2015028700 A1 | 3/2015 | |
| WO | 2015/058827 A1 | 4/2015 | |
| WO | 2015/067336 A2 | 5/2015 | |
| WO | 2015/139802 A1 | 9/2015 | |
| WO | 2015/154845 A1 | 10/2015 | |
| WO | 2016/037678 A1 | 3/2016 | |
| WO | 2016/041615 A1 | 3/2016 | |
| WO | 2016/123286 A1 | 8/2016 | |

OTHER PUBLICATIONS

Allard et al; Organic Semiconductors for Solution-Processable Field-Effect Transistors (OFETS); Angrw. Chem. Int. Ed. 2008, 47, pp. 4070-4098.
Bronstein et al "Thieno [3,2-b]Thiophene-Diketopyrrolopyrrole-Containing Polymers for Hihg-Performance Organic Field-Effect Transistors and Organic Photovoltaic Devices"; J. Am. Chem. Soc. 2011, 133, pp. 3272-3275.
Chen et al; "Large Interfacial Area Enhances Electrical Conductivity of Poly(3-Hexylthiophene)/Insulating Polymer Blends"; RSC Advnaces (2015), 5(3), pp. 1777-1784.
Choi et al; "Elastomer-Polymer Semiconductor Blends for High-Performance Stretchable Charge Transport Networks". Chem. Mater., 2016, 28 (4), pp. 11961204.
Chou et al; "Controllable Electrical Performance of Spray-Coated Semiconducting Small Molefule/Insulating Polymer Blend Thin Film for Organic Field Effect Transistors Application" ; Reactive and Funcional Polymers; 108 (2016) pp. 130-136.
Chung et al; "Zone-Refinement Effect in Small Molecule-Polymer Blend Semiconductors for Organic Thin-Film Transistors"; Journal of the American Chemical Society (2011), 133(3), pp. 412-415.
Elkington et al; "Organic Thin-Film Transistor (OTFT)-Based Sensors"; Electronics 2014, 3, pp. 234-254.
Ferenczi et al; "Organic Semiconductor:Insulator Polymer Ternary Blends for Photovoltaics"; Advnaced Materials (2011), 23(35), pp. 4093-4097.

Fong et al; "Tetrathienoacene Copolymers as High Mobility, Soluble Organic Semiconductors" ; J. Am. Chem. Soc. 2008, 130, pp. 13202-13203.
Ford et al; "High Mobility Organic Field-Effect Transistors From Majority Insulator Blends". Chemistry of Materials (2016), 28(5), 1256-1260.
Georgakopoulos et al; "Flexible Organic Transistors Based on a Solution-Sheared PVDF Insulator" ; Journal of Materials Chemistry C: Materials for Optical and Electronic Devices (2015), 3(47), pp. 12199-12202.
Guo et al; "Current Status and Opportunities of Organic Thin-Film Transistor Technologies"; IEEE Transactions on Electron Devices, vol. 64, No. 5, May 2017; pp. 1906-1921.
Han et al; "Solvent-Dependent Electrical Properties Improvement of Organic Field-Effect Transistor Based on Disordered Conjugated Polymer/Insulator Blends"; Organic Electronics (2015), 27, pp. 160-166.
He et al; "Alkylsubstituted Thienothiphene Semiconducting Materials: Structure-Property Relationships"; J. Am. Chem. Soc. 2009, 131, pp. 11930-11938.
Holliday et al; "Advances in Charge Carrier Mobilities of Semiconducting Polymers Used in Organic Transistors"; Chem. Mater. 2014, 26(1), pp. 647-663.
Hwang et al; "Top-Gate Organic Field-Effect Transistors With High Environmental and Operational Stability"; Advanced Materials; (2011), 23(10), pp. 1293-1298.
Ibrahim et al; "Thermo-Mechanical Stabilisation of a Crystalline Organic Semiconductor for Robust Large Area Electronics"; Organic Electronics (2010), 11(7), pp. 1234-1241.
International Search Report and Written Opinion of the International Searching Authority; PCT/US2018/035700; dated Oct. 15, 2018; 12 Pages; European Patent Office.
Jo et al; "Polymer Blends With Semiconducting Nanowires for Organic Electronics" Journal of Materials Chemistry (2012), 22(10), pp. 4244-4260.
Kang et al; "Record High Hole Mobility in Polymer Semiconductors via Side-Chain Engineering"; J. Am Chem. Soc. 2013, 135 , pp. 14896-14899.
Kang et al; "Structure and Properties of Small Molecule-Polymer Blend Semiconductors for Organic Thin Film Transistors" ; Journal of the American Chemical Society (2008), 130(37), pp. 12273-12275.
Katz; "Recent Advances in Semiconductor Performance and Printing Processes for Organic Transistor-Based Electronics"; Chem. Mater. 2004, 16, pp. 4748-4756.
Kim et al; "Metal Insulator Semiconductor Coaxial Microfibers Based on Self-Organization of Organic Semiconductor: Polymer Blend for Weavable, Fibriform Organic Field-Effect Transistors"; Advanecd Functional Materials (2016), 26(16), 2706-2714.
Kim et al; "Non-Volatile Organic Memory Based on CdSe Nano-Particle/PMMA Blend as a Tunneling Layer"; Synthetic Metals (2011), 161(13-14), pp. 1155-1158.
Kwak et al; "Tailoring Morphology and Structure of Inkjet-Printed Liquid-Crystalline Semiconductor/Insulating Polymer Blends for High-Stability Organic Transistors" Advanced Functional Materials (2016), 26(18), pp. 3003-3011.
Lee et al; "Enhanced Electrical Stability of Organic Thin-Film Transistors With Polymer Semiconductor-Insulator Blended Active Layers" Appliws Physics Letters (2012), 100(8), pp. 083302-1-083302-5.
Lee et al; "Organic Semiconductor/Insulator Polymer Blends for High-Performance Organic Transistors"; Polymers; (2014), 6(4), 1057-1073, 17 pages.
Lei et al; "Enhancing Crystalline Structural Orders of Polymer Semiconductors for Efficient Charge Transport via Polymer-Matrix-Mediated Molecular Self-Assembly"; Adv. Mater.; 2016, 28; pp. 6687-6694.
Li et al; A High Mobility P-Type DPP-Thieno [3,2-b]Thiophene Copolymer for Organic Thin-Film Transistors; Adv. Mater. 2010, 22, pp. 48624866.
Lim et al; "Inkjet-Printed Single-Droplet Organic Transistors Based on Semiconductor Nanowires Embedded in Insulating Polymers"; Advanced Functional Materials (2010), 20(19), pp. 3292-3297.

(56) References Cited

OTHER PUBLICATIONS

Lim et al; "Morphology and Microcrystalline Structure of Inkjet-Printed Organic Semiconductors for Organic Transistors"; Polymer Preprints, 51, (1); (2010) pp. 238-239.

Lin et al; "Morphology and Field-Effect Transistor Characteristics of Semicrystalline Poly(3-Hexylthiophene) and Poly(Stearyl Acrylate) Blend Nanowires"; J. Mater. Chem.; (2012), 22(29), pp. 14682-14690.

Lu et al; "Moderate Doping Leads to High Performance of Semiconductor/Insulator Polymer Blend Transistors" ; Nature Communications (2013), ncomms2587, 8 Pages.

Madec et al; "Organic Field Effect Transistors From Ambient Solution Processed Low Molar Mass Semiconductor-Insulator Blends"; Journal of Materials Chemistry (2008), 18 (27), pp. 3230-3236.

Madec et al; "Organic Semiconductor-Polymer Insulator Blends: A Morphological Study of the Guest-Host Interactions"; e-Journal of Surface Science and Nanotechnology (2009), 7, pp. 455-458.

Malti et al; "Low-Voltage Ambipolar Polyelectrolyte-Gated Organic Thin Film Transistors"; Applied Physics Letters (2012), 100(18), pp. 183302-1-183302-3.

Matthews et al; "Scalabel Synthesis of Fused Thiophene-Diketopyrrolopyrrole Semiconducting Polymers Processed From Non-Chlorinated Solvents Into High Performance Thin Film Transistors"; Chem. Mater.; 2013; 25; pp. 782-789.

Murphy et al; "Wire-Bar Coating of Semiconducting Polythiophene/Insulating Polyethylene Blend Thin Films for Organic Transistors" ; Journal of Applied Physics (2011), 110(9), pp. 093523-1-093523-7.

Park et al; "Origin of Bias-Stress Induced Instability in Organic Thin-Film Transistors With Semiconducting Small-Molecule/Insulating Polymer Blend Channel"; ACS Applied Materials & Interfaces (2013), 5(5), pp. 1625-1629.

Park et al; "Photo-Assisted Molecular Engineering in Solution-Processed Organic Thin-Film Transistors With a Blended Semiconductor for High Mobility Anisotropy"; Applied Physics Letters (2013), 102(1), pp. 013306-1-013306-5.

Qiu et al; "Organic Thin-Film Transistors Based on Blends of Poly(3-hexylthiophene) and Polystyrene With a Solubility-Induced Low Percolation Threshold" ; Chem. Mater. (2009) 21, pp. 4380-4386.

Qiu et al; "Organic Thin-Film Transistors With a Photo-Patternable Semiconducting Polymer Blend"; Journal of Materials Chemistry (2011), 21(39), pp. 15637-15642.

Scaccabarozzi et al; "Semiconducting:Insulating Polymer Blends for Optoelectronic Applications—A Review of Recent Advances"; Journal of Materials Chemistry A: Materials for Energy and Sustainability; (2014), 2(28), pp. 10818-10824.

Shin et al; "Vertically Segregated Structure and Properties of Small Molecule-Polymer Blend Semiconductors for Organic Thin-Film Transistors"; Advanced Functional Materials (2013), 23(3), pp. 366-376.

Sirringhaus et al; "Two-Dimensional Charge Transport in Self-Organized, High-Mobility Conjugated Polymers"; Nature 1999, 401, pp. 685-688.

Sun et al; "Record High Electron Mobility of 6.3 cm2V-1s-1 Achieved for Polymer Semiconductors Using a New Buliding Block". Advanced Materials; (2014), 26(17), pp. 2636-2642.

Wang et al; "Self-Stratified Semiconductor/Dielectric Polymer Blends: Vertical Phase Separation for Facile Fabrication of Organic Transistors"; Journal of Materials Chemistry C: Materials for Optical and Electronic Devices (2013), 1(25), pp. 3989-3998.

Wolfer et al; "Semiconducting Arylacetylene: Insulating Polymer Blends for Organic-Based Electronic Devices"; Mater. Res. Soc. Symp. Proc. vol. 1402, (2012) 6 pages.

Wu et al; "Effects of Soft Insulating Polymer Doping on the Photovoltaic Properites of Polymer-Fullerene Blend Solar Cells"; Journal of Physical Chemistry C (2013), 117(17), pp. 8691-8696.

Yoo et al; "Self-Assembled, Millimeter-Sized Tips-Pentacene Spherulites Grown on Partially Crosslinked Polymer Gate Dielectric" ; Advanced Functional Materials (2015), 25 (24), pp. 3658-3665.

Taiwanese Patent Application No. 107119614, Office Action dated Jan. 7, 2022, 3 pages (English Translation Only); Taiwanese Patent Office.

* cited by examiner

DOPING OF OTHER POLYMERS INTO ORGANIC SEMI-CONDUCTING POLYMERS

This application claims the benefit of priority under 37 U.S.C. § 371 to International Patent Application No. PCT/US2018/035700, filed Jun. 1, 2018, which claims the benefit of priority under 35 U.S.C. § 119 to U.S. Provisional Patent Application No. 62/516,943, filed Jun. 8, 2017, the contents of all of which are relied upon and incorporated herein by reference in their entirety.

FIELD

The present invention relates generally to polymer blends containing an organic semiconducting polymer.

BACKGROUND

Organic semiconductors are used in variety of applications, including electronics, organic transistors, organic light-emitting diodes (OLEDs), organic integrated circuits, organic solar cells, and others. Enhancing the performance of organic semiconductors is of interest in numerous applications.

BRIEF SUMMARY

One embodiment relates to a polymer blend comprising an organic semiconductor polymer blended with an isolating polymer. In some embodiments the organic semiconductor polymer is a diketopyrrolopyrrole fused thiophene polymeric material. In some embodiments the fused thiophene is beta-substituted. In some embodiments, the isolating polymer has a non-conjugated backbone. In some embodiments, the isolating polymer is selected from the group consisting of polyacrylonitrile, alkyl substituted polyacrylonitrile, polystyrene, polysulfonate, polycarbonate, an elastomer block copolymer, derivatives thereof, copolymers thereof and mixtures thereof.

In some embodiments, the embodiments of any of the preceding paragraphs may further include the organic semiconductor polymer comprises the repeat unit of formula 1' or 2'.

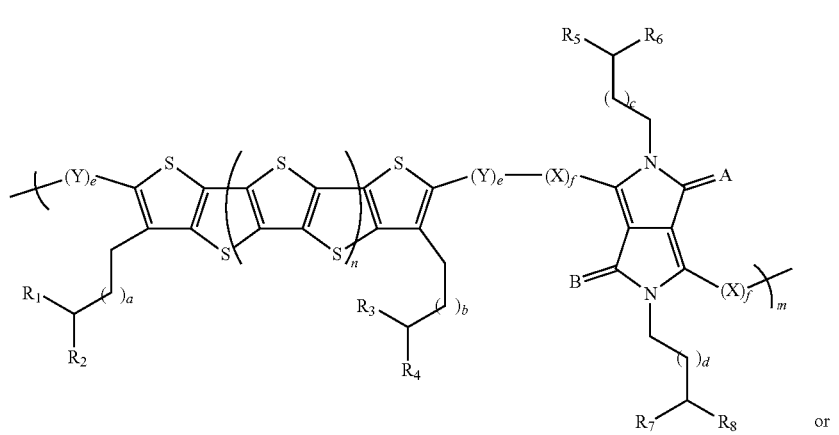

or

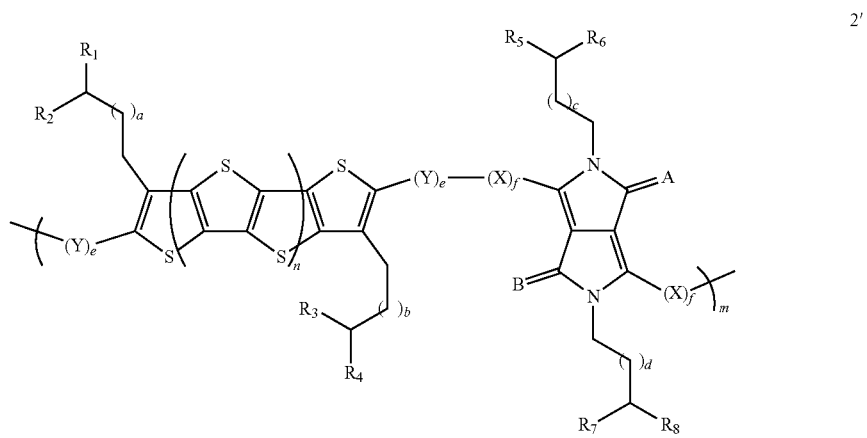

In some embodiments, in the structure 1' and 2', m is an integer greater than or equal to one; n is 0, 1, or 2; $R_1$, $R_2$, $R_3$, $R_4$, $R_5$, $R_6$, $R_7$, and $R_8$, may be, independently, hydrogen, substituted or unsubstituted $C_4$ or greater alkyl, substituted or unsubstituted $C_4$ or greater alkenyl, substituted or unsubstituted $C_4$ or greater alkynyl, or $C_5$ or greater cycloalkyl; a, b, c, and d are independently, integers greater than or equal to 3; e and f are integers greater than or equal to zero; X and Y are, independently a covalent bond, an optionally substituted aryl group, an optionally substituted heteroaryl, an optionally substituted fused aryl or fused heteroaryl group, an alkyne or an alkene; and A and B may be, independently, either S or O, with the provisos that:

i. at least one of $R_1$ or $R_2$; one of $R_3$ or $R_4$; one of $R_5$ or $R_6$; and one of $R_7$ or $R_8$ is a substituted or unsubstituted alkyl, substituted or unsubstituted alkenyl, substituted or unsubstituted alkynyl, or cycloalkyl;

ii. if any of $R_1$, $R_2$, $R_3$, or $R_4$ is hydrogen, then none of $R_5$, $R_6$, $R_7$, or $R_8$ are hydrogen;

iii. if any of $R_5$, $R_6$, $R_7$, or $R_8$ is hydrogen, then none of $R_1$, $R_2$, $R_3$, or $R_4$ are hydrogen;

iv. e and f cannot both be 0;

v. if either e or f is 0, then c and d, independently, are integers greater than or equal to 5; and vi. the polymer having a molecular weight, wherein the molecular weight of the polymer is greater than 10,000.

In some embodiments, the embodiments of any of the preceding paragraphs may further include the isolating polymer is polystyrene and derivatives thereof.

In some embodiments, the embodiments of any of the preceding paragraphs may further include the polystyrene has a molecular weight of greater than 5,000.

In some embodiments, the embodiments of any of the preceding paragraphs may further include the polystyrene has a molecular weight of greater than 10,000.

In some embodiments, the embodiments of any of the preceding paragraphs may further include the isolating polymer forms an encapsulating layer between the organic semiconductor and an air interface.

In some embodiments, the embodiments of any of the preceding paragraphs may further include the isolating polymer oxidizes preferentially to the organic semiconductor polymer.

In some embodiments, the embodiments of any of the preceding paragraphs may further include the isolating polymer that oxidizes preferentially to the organic semiconductor polymer is polyacrylonitrile, alkyl substituted polyacrylonitrile, or copolymers thereof.

In some embodiments, the embodiments of any of the preceding paragraphs may further include the weight ratio of organic semiconductor polymer to isolating polymer in the blend is between 95:5 and 5:95.

In some embodiments, the embodiments of any of the preceding paragraphs may further include the weight ratio of organic semiconductor polymer to isolating polymer in the blend is between 80:20 and 40:60.

In some embodiments, the embodiments of any of the preceding paragraphs may further include wherein the weight ratio of organic semiconductor polymer to isolating polymer in the blend is between 55:45 and 65:35.

Another embodiment relates to an organic semiconductor device comprising blending an organic semiconductor polymer with an isolating polymer in an organic solvent to create a polymer blend; and depositing a thin film of the polymer blend over a substrate. In some embodiments the organic semiconductor polymer is a diketopyrrolopyrrole fused thiophene polymeric material. In some embodiments the fused thiophene is beta-substituted. In some embodiments isolating polymer has a non-conjugated backbone. In some embodiments the non-conjugated polymer is selected from the group consisting of: polyacrylonitrile, alkyl substituted polyacrylonitrile, polystyrene, polysulfonate, polycarbonate, an elastomer block copolymer, derivatives thereof, copolymers thereof and mixtures thereof.

In some embodiments, the embodiments of any of the preceding paragraphs may further include thermally annealing the thin film after the thin film is deposited over the substrate.

In some embodiments, the embodiments of any of the preceding paragraphs may further include the annealing step is performed at a temperature of 100° C. to 180° C.

In some embodiments, the embodiments of any of the preceding paragraphs may further include the thin film is annealed in air.

In some embodiments, the embodiments of any of the preceding paragraphs may further include the organic semiconductor polymer comprises the repeat unit of formula 1' or 2'.

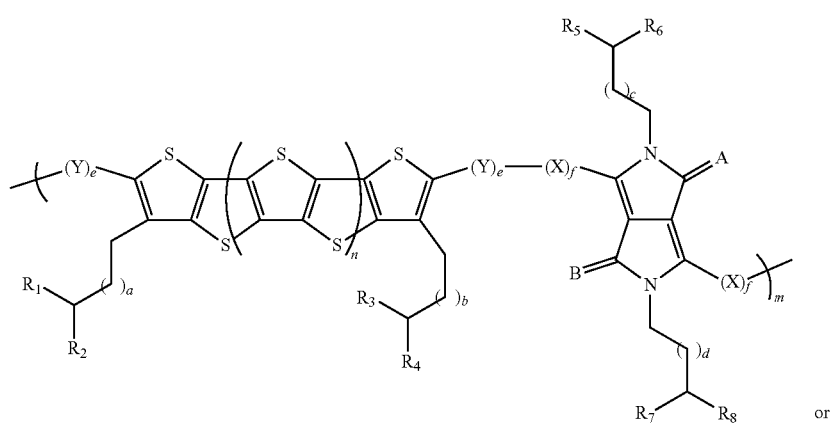

-continued

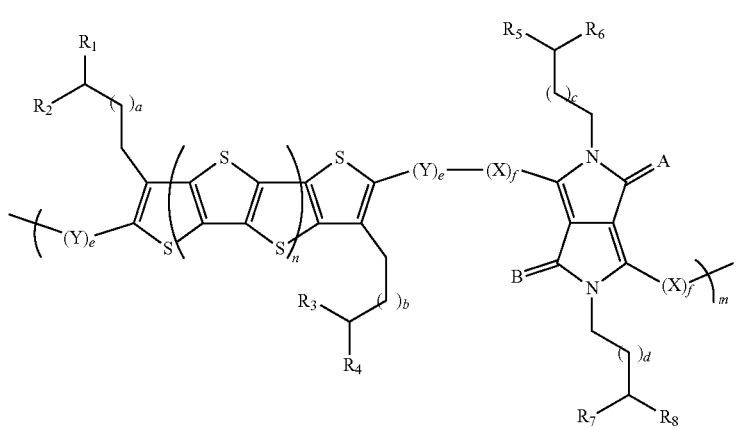

In some embodiments in the structure 1' and 2', m is an integer greater than or equal to one; n is 0, 1, or 2; $R_1$, $R_2$, $R_3$, $R_4$, $R_5$, $R_6$, $R_7$, and $R_8$, may be, independently, hydrogen, substituted or unsubstituted $C_4$ or greater alkyl, substituted or unsubstituted $C_4$ or greater alkenyl, substituted or unsubstituted $C_4$ or greater alkynyl, or $C_5$ or greater cycloalkyl; a, b, c, and d are independently, integers greater than or equal to 3; e and f are integers greater than or equal to zero; X and Y are, independently a covalent bond, an optionally substituted aryl group, an optionally substituted heteroaryl, an optionally substituted fused aryl or fused heteroaryl group, an alkyne or an alkene; and A and B may be, independently, either S or O, with the provisos that:

i. at least one of $R_1$ or $R_2$; one of $R_3$ or $R_4$; one of $R_5$ or $R_6$; and one of $R_7$ or $R_8$ is a substituted or unsubstituted alkyl, substituted or unsubstituted alkenyl, substituted or unsubstituted alkynyl, or cycloalkyl;

ii. if any of $R_1$, $R_2$, $R_3$, or $R_4$ is hydrogen, then none of $R_5$, $R_6$, $R_7$, or $R_8$ are hydrogen;

iii. if any of $R_5$, $R_6$, $R_7$, or $R_8$ is hydrogen, then none of $R_1$, $R_2$, $R_3$, or $R_4$ are hydrogen;

iv. e and f cannot both be 0;

v. if either e or f is 0, then c and d, independently, are integers greater than or equal to 5; and vi. the polymer having a molecular weight, wherein the molecular weight of the polymer is greater than 10,000.

In some embodiments, the embodiments of any of the preceding paragraphs may further include the isolating polymer is polystyrene and derivatives thereof.

In some embodiments, the embodiments of any of the preceding paragraphs may further include the polystyrene has a molecular weight of greater than 5,000.

In some embodiments, the embodiments of any of the preceding paragraphs may further include the polystyrene has a molecular weight of greater than 10,000.

In some embodiments, the embodiments of any of the preceding paragraphs may further include the organic solvent is a non-halogenated solvent.

In some embodiments, the embodiments of any of the preceding paragraphs may further include the non-halogenated solvent is selected from the group consisting of: m-xylene, o-xylene, p-xylene, toluene, tetralin, cis-decalin, trans-decalin, mesitylene, cyclooctane, and bicyclohexyl, and mixtures thereof.

In some embodiments, the embodiments of any of the preceding paragraphs may further include blending an organic semiconductor polymer with an isolating polymer in an organic solvent to create a polymer blend is performed at a temperature greater than 70° C.

In some embodiments, the embodiments of any of the preceding paragraphs may further include the organic semiconductor polymer and the isolating polymer each have a solubility of 1 mg/mL or more in the non-halogenated solvent at room temperature.

Another embodiment relates to an organic semiconductor device, comprising a thin semiconducting film, the thin semiconducting film comprising a polymer blend. In some embodiments the polymer blend comprises an organic semiconductor polymer blended with an isolating polymer. In some embodiments the organic semiconductor polymer is a diketopyrrolopyrrole fused thiophene polymeric material. In some embodiments the fused thiophene is beta-substituted. In some embodiments the isolating polymer is selected from the group consisting of polyacrylonitrile, alkyl substituted polyacrylonitrile, polystyrene, polysulfonate, polycarbonate, an elastomer block copolymer, derivatives thereof, copolymers thereof and mixtures thereof.

BRIEF DESCRIPTION OF THE DRAWINGS/FIGURES

DETAILED DESCRIPTION OF THE INVENTION

Figure 1:
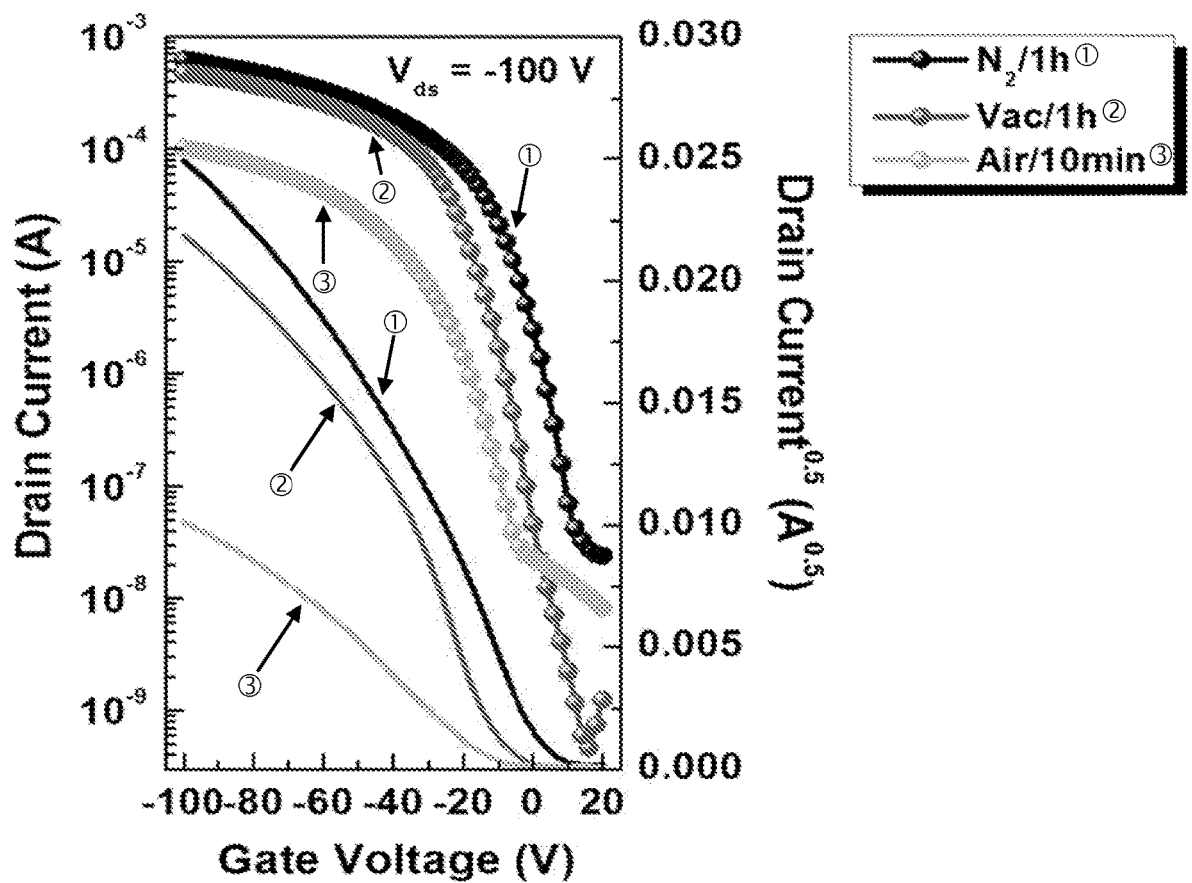
FIG. 1 is a chart showing performance of the polymer of structure 4 after being thermally annealed in nitrogen or air.

Embodiments of the present disclosure will now be described in detail with reference to the accompanying drawings. References to "one embodiment", "an embodiment", "an exemplary embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The use of organic semiconductors (OSC) as functional materials has become a reality in a number of different applications for the electronics industry including, for example, printed electronics, organic transistors, including organic thin-film transistors (OTFTs) and organic field-effect transistors (OFETs), organic light-emitting diodes (OLEDs), organic integrated circuits, organic solar cells, and disposable sensors. Organic transistors may be used in many applications, including smart cards, security tags, and the backplanes of flat panel displays. Organic semiconductors may substantially reduce cost compared to inorganic counterparts, such as silicon. Depositing the OSC from solution may enable fast, large-area fabrication routes such various printing methods and roll-to-roll processes.

In some applications, annealing the OSC in air significantly reduces the cost of device production, compared to annealing in nitrogen or vacuum. However, in some applications, annealing in air can lead to reduced device performance. Thus, it is desirable to manufacture formulations that maintain device performance after annealing in air.

Organic Semiconductor

An organic semiconducting (OSC) polymer can be used to produce organic semiconductor devices. In some embodiments, the OSC polymer has a main backbone that is fully conjugated. In some embodiments, the organic semiconductor is a diketopyrrolopyrrole (DPP) fused thiophene polymeric material. In some embodiments, the fused thiophene is beta-substituted. This organic semiconductor may contain both fused thiophene and diketopyrrolopyrrole units. In some embodiments, the organic semiconductor is used in an organic thin-film transistor (OTFT) application. For example, as shown in structures 1 and 2, the OSC can have conjugated groups X and Y. In some embodiments, X and Y are conjugated groups that are connected to the DPP and fused thiophene moieties in such a way as to provide a continuous conjugated pathway along the polymer backbone. In some embodiments, $R_1$, $R_2$, $R_3$, and $R_4$ are alkyl chains that impart solubility. In some embodiments, beta-substitution improves solubility. In some embodiments, the OSC has a solubility of 0.5 mg/mL, 1 mg/mL, 2 mg/mL, 3 mg/mL, 4 mg/mL, 5 mg/mL, or any range defined by any two of those endpoints. In some embodiments, the OSC has a solubility of 1 mg/mL or more at room temperature. In some embodiments, these polymers enable simple transistor fabrication at relatively low temperatures, which is particularly important for the realization of large-area, mechanically flexible electronics. A beta-substituted OSC polymer can also help to improve solubility.

Generic structures of DPP fused thiophene polymers are shown in structures 1 and 2. The incorporation of fused thiophenes into polymers further containing DPP can result in more stable DPP conjugated copolymer structures, improved solubility of the copolymer due to the large alkyl-based R-groups on the fused thiophene moieties, and improved electronic and optical properties due to the larger conjugation units.

Structure 1

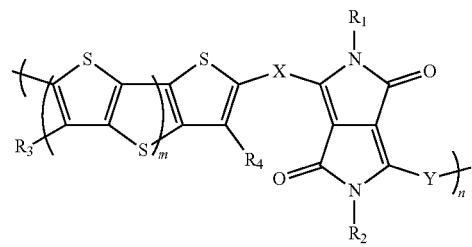

Structure 2

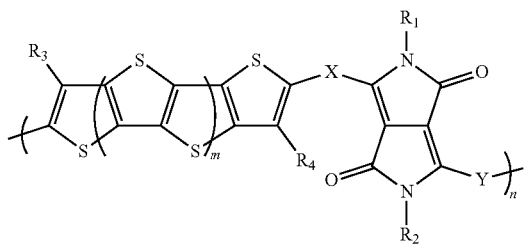

In some embodiments, the DPP fused thiophene polymeric material has the structure as shown in structure 3 or 4. In some embodiments, these DPP and fused thiophene polymers have hole mobilities of 1 $cm^2V^{-1}s^{-1}$, 2 $cm^2V^{-1}s^{-1}$, 3 $cm^2V^{-1}s^{-1}$, 4 $cm^2V^{-1}s^{-1}$, 5 $cm^2V^{-1}s^{-1}$, 10 $cm^2V^{-1}s^{-1}$, or any range defined by any two of those endpoints. The hole mobilities may be equal to or greater than any of these values. In one embodiments, the DPP and fused thiophene polymers have hole mobilities of 1 to 4 $cm^2V^{-1}s^{-1}$. In one embodiment, the DPP and fused thiophene polymers have hole mobilities of 2 $cm^2V^{-1}s^{-1}$. In some embodiments, the DPP and fused thiophene polymers have hole mobilities of 2 $cm^2V^{-1}s^{-1}$ or more.

In some embodiments, the DPP and fused thiophene polymers have On/Off ratio of greater than $10^5$. In some embodiments, the DPP and fused thiophene polymers have On/Off ratio of greater than $10^6$.

In some embodiments, the DPP and fused thiophene polymers have a threshold voltage in thin film transistor devices of 1 V, 2 V, 3V, 4 V, 5 V, 10 V, or any range defined by any two of those endpoints. In one embodiment, the DPP and fused thiophene polymers have a threshold voltage of 1-3 V in thin film transistor devices. In one embodiment, the DPP and fused thiophene polymers have a threshold voltage of 2 V in thin film transistor devices.

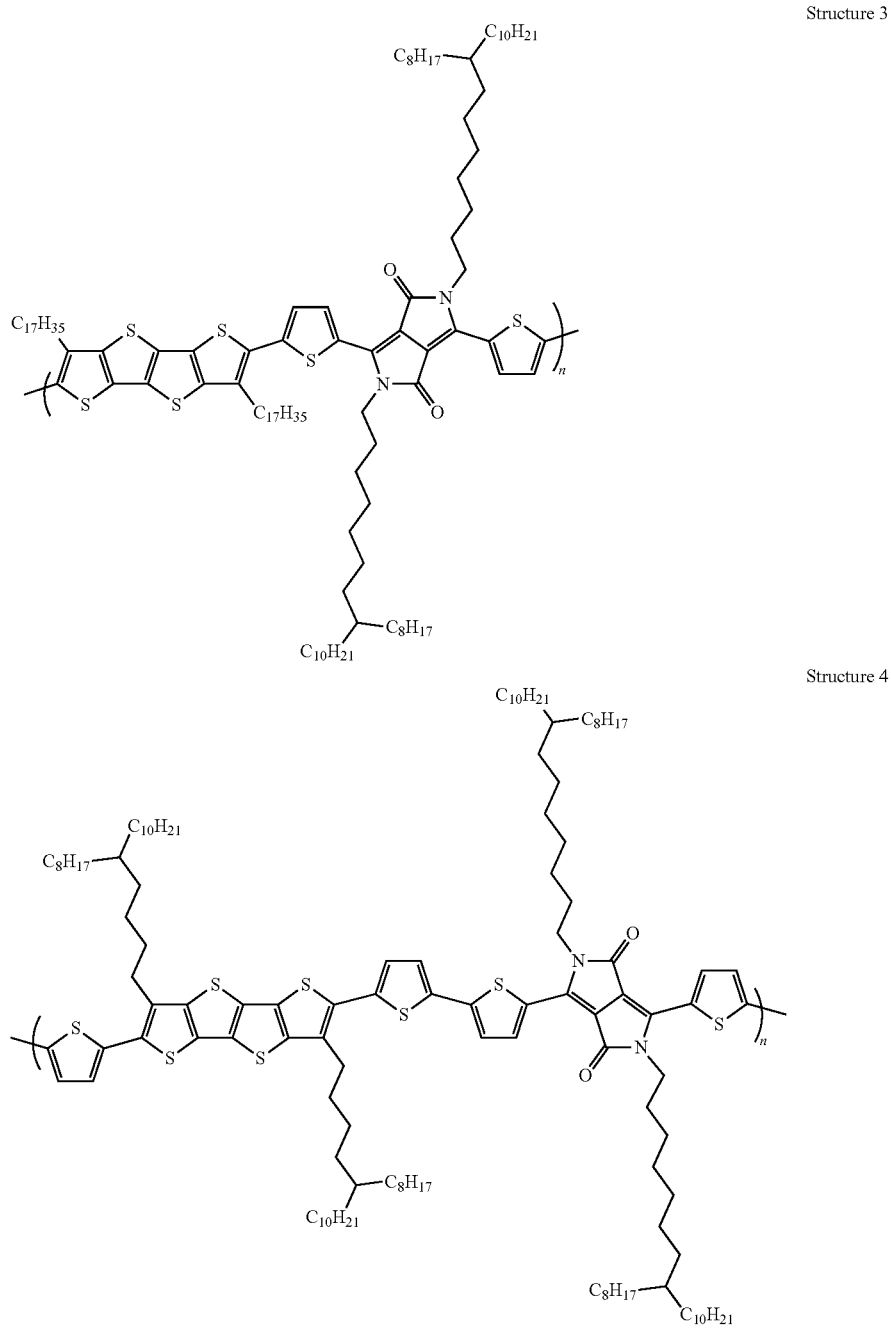

Structure 3

Structure 4

In some embodiments, the organic semiconductor comprises the structure as shown in structures 5 and 6. In some embodiments, structures shown in structures 5 and 6 contain functional groups $R_1$, $R_2$, $R_3$, $R_4$, $R_5$, $R_6$, $R_7$, and $R_8$, repeat units m and n, and groups a, b, c, d, e, f, A, B, X, and Y. In some embodiments m is an integer greater than or equal to one; n is 0, 1, or 2; $R_1$, $R_2$, $R_3$, $R_4$, $R_5$, $R_6$, $R_7$, and $R_8$, may be, independently, hydrogen, substituted or unsubstituted $C_4$ or greater alkyl, substituted or unsubstituted $C_4$ or greater alkenyl, substituted or unsubstituted $C_4$ or greater alkynyl, or $C_5$ or greater cycloalkyl; a, b, c, and d are independently, integers greater than or equal to 3; e and f are integers greater than or equal to zero; X and Y are, independently a covalent bond, an optionally substituted aryl group, an optionally substituted heteroaryl, an optionally substituted fused aryl or fused heteroaryl group, an alkyne or an alkene; and A and B may be, independently, either S or O.

In some embodiments, at least one of $R_1$ or $R_2$; one of $R_3$ or $R_4$; one of $R_5$ or $R_6$; and one of $R_7$ or $R_8$ is a substituted or unsubstituted alkyl, substituted or unsubstituted alkenyl, substituted or unsubstituted alkynyl, or cycloalkyl. In some embodiments, if any of $R_1$, $R_2$, $R_3$, or $R_4$ is hydrogen, then none of $R_5$, $R_6$, $R_7$, or $R_8$ are hydrogen. In some embodiments, if any of $R_5$, $R_6$, $R_7$, or $R_8$ is hydrogen, then none of $R_1$, $R_2$, $R_3$, or $R_4$ are hydrogen. In some embodiments, e and f cannot both be 0. In some embodiments, if either e or f is 0, then c and d, independently, are integers greater than or equal to 5. In some embodiments, the polymer has a molecular weight greater than 10,000.

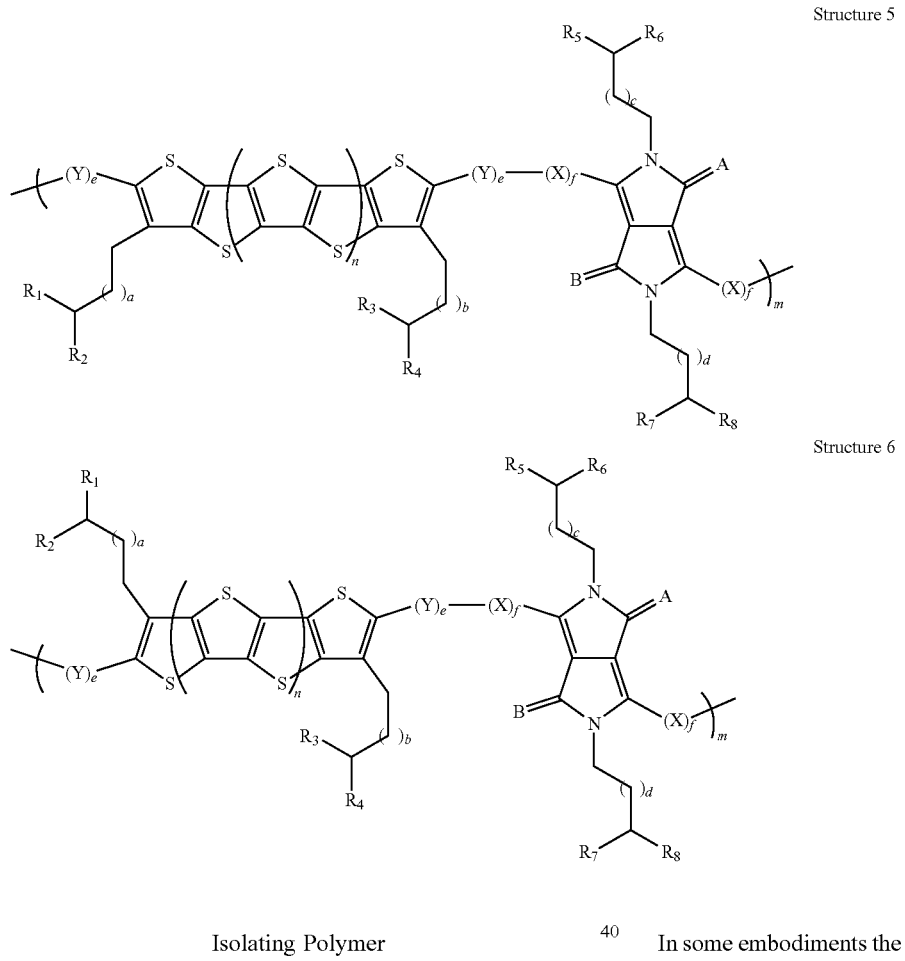

Structure 5

Structure 6

Isolating Polymer

In some embodiments the OSC polymer is blended with an isolating polymer. In some embodiments, the isolating polymer is a non-conjugated polymer. In some embodiments, the isolating polymer has a non-conjugated backbone and conjugated side-chains. Blending with an isolating polymer that is non-conjugated or has a non-conjugated backbone avoids phase separation that can occur when the OSC is blended with a conjugated polymer. In some embodiments, the isolating polymer is not a semi-conducting polymer.

In some embodiments an isolating polymer is blended with the OSC polymer to prevent oxidation of the OSC. In some embodiments, the isolating polymer is selected from polyacrylonitrile (PAN), alkyl substituted polyacrylonitrile (R-PAN), polyethylene (PE) and its copolymer, polystyrene, polystyrene-co-acrylonitrile, variants of polydimethylsiloxane (PDMS), polysulfonate, polyvinylacetate, polycarbonate, polypropylene, poly(methyl methacrylate), polyamide, polyphenylene sulfide, and elastomers such as a polymethylmethacylate-block-polybutylacrylate (PMMA-b-PBA). In some embodiments, the isolating polymer is polyacrylonitrile.

In some embodiments, the isolating polymer is polystyrene, or derivatives of polystyrene. The use of polystyrene as the isolating polymer may enable large-scale production of OSC devices. Further, polystyrene enables pre-aggregation and better alignment of the semiconductor.

In some embodiments the isolating polymer has a molecular weight of 1,000, 2,000, 3,000, 4,000, 5,000, 10,000, 15,000, 20,000, 25,000, 35,000, 45,000, 50,000, 75,000, 100,000, 125,000, 150,000, 175,000, 200,000, 225,000, 250,000, or any range defined by any two of those endpoints. In some embodiments, the molecular weight of the isolating polymer is 5,000 or more. In some embodiments, the molecular weight of the isolating polymer is 10,000 or more. In some embodiments, the molecular weight of the isolating polymer is between 50,000 and 200,000.

Polymer Blend

In some embodiments, the performance of a device comprising the OSC polymer can be improved by blending the OSC polymer with another polymer. In some embodiments, the OSC polymer is blended with the isolating polymer in a solvent. Another advantage of the polymers such as those in structures 1-4 is that they can be processed easily in non-halogenated solvents. In some embodiments, the non-halogenated solvent is used to dissolve the mixture of OSC polymers with the isolating polymer. In some embodiments, the non-halogenated solvent is selected from m-xylene, o-xylene, p-xylene, toluene, tetralin, cis-decalin, trans-decalin, mesitylene, cyclooctane, and bicyclohexyl. In some embodiments, a mixture of more than one solvent may be used.

In some embodiments, the isolating polymer is polystyrene, and the polystyrene plus the non-halogenated solvent enables pre-aggregation and better alignment of the semiconductor.

In some embodiments the weight ratio of the OSC polymer to the isolating polymer is 95:5, 90:10, 85:15, 80:20, 75:25, 70:30, 65:35, 60:40, 55:45, 50:50, 45:55, 60:40, 65:35, 70:30, 75:25, 80:20, 85:15, 90:10, 95:5, or any range defined by any two of those endpoints.

In some embodiments, the blending of an isolating polymer with the OSC polymer can improve performance when the polymer is annealed in air and when the polymer is stored in air.

Figure 2:
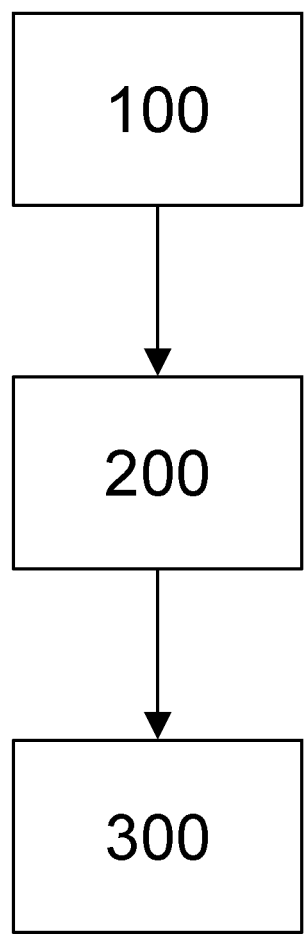
FIG. 2 shows a flow chart for an exemplary process of fabricating an organic semiconductor device.

FIG. 2 shows a flow chart for an exemplary method of fabricating an organic semiconductor device. At step 100, the organic semiconductor polymer is blended with the isolating polymer in an organic solvent. At step 200, a thin film of the blended polymer is deposited over a substrate. Optionally, at step 300, the thin film is thermally annealed. In some embodiments, the thermal annealing is performed at a temperature of 100° C. to 180° C. in air.

Mechanisms

The performance of an OSC device is usually evaluated by several parameters, including charge carrier mobility, current On/Off ratio, threshold voltage, and the magnitude of the On current. In some applications, it is useful to achieve high parameters from a solution deposition process with a minimum number of processing steps. Such applications include preparing stable inks or formulations of the polymeric semiconducting materials. Besides intrinsic properties of OSC materials, several other factors can significantly affect the performance OSC materials in real applications. One of those is the possibility an unwanted decrease in device performance of OSC materials after thermal annealing. Thermal annealing is done to promote chain alignment and induce higher performance. However, annealing of some semi-conducting polymers in the presence of oxygen can cause a reduction in performance when compared to performance of devices annealed in nitrogen. The article "Enhancing Crystalline Structural Orders of Polymer Semiconductors for Efficient Charge Transport via Polymer-Matrix-Mediated Molecular Self-Assembly", Advanced Materials (Weinheim, Germany) (2016), 28(31), 6687-6694, proposes blending a low molecular weight donor-acceptor OSC polymer, such as P1 (structure 7), with a non-conjugated polymer polyacrylonitrile (structure 8) in a 60/40 wt % ratio (P1/PAN). The resulting OTFT devices exhibited mobility of 16 cm$^2$V$^{-1}$s$^{-1}$ and current On/Off ratio of greater than 10$^8$. This mobility is about one order of magnitude higher than that produced in devices made from the pure P1 polymer. The article proposed a possible mechanism of enhancing crystalline structural order of this low molecular weight donor-acceptor OSC polymer P1 by blending with PAN.

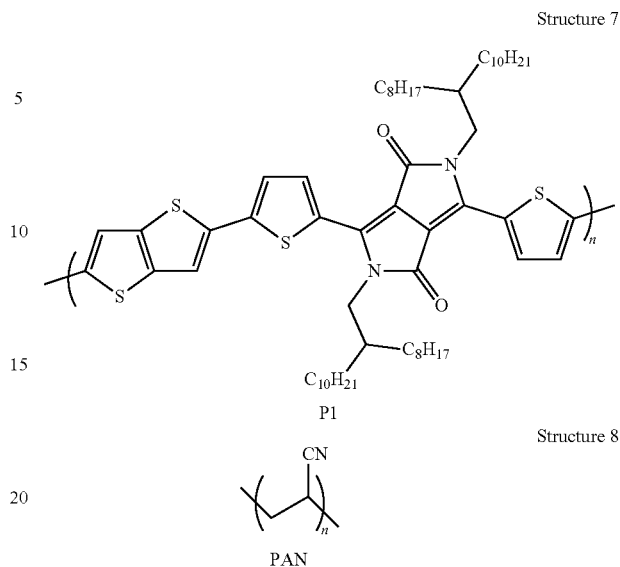

Despite the increase in mobility and On/Off ratio, the PAN used in the Advanced Materials article has a MW of 150,000 (Aldrich), and this high molecular weight PAN results in limited solubility in organic solvents, even in hot chloroform. This makes the real weight ratio of the OSC polymer to PAN in the OTFTs devices disclosed in the Advanced Materials article unreliable.

It was found that the device performance, such as current On/Off ratio and the hole mobility, of the polymers having the structure shown in structures 3 and 4 decreased significantly after thermal annealing in air, as compared to similar devices that were thermally annealed under nitrogen (Tables 1 and 2, FIG. 1).

Various mechanisms are described herein that can be used to prevent air oxidation of OSC polymers. In some embodiments, a dielectric polymer is blended with organic semiconducting polymers. These mechanisms are applicable to devices made with any semiconducting polymer that is susceptible to performance degradation upon heating at elevated temperatures in air. The mechanisms described may work alone, or in combination with other mechanisms.

In some embodiments, a first mechanism involves forming an encapsulating layer around the OSC to reduce air contact. In the first mechanism, an isolating polymer forms an encapsulating layer around the OSC materials to reduce the air contact, which in turn reduces the probability of oxidation of the OSC polymer. This mechanism provides localized encapsulation for the OSC polymer without creating OSC polymer micro-interfacial interactions or preventing continuous electronic pathways across each device.

In some embodiments, a second mechanism involves blending a high-crystallinity polymer with the OSC polymer. This mechanism enhances crystalline structural order of the OSC polymers, which in turn increases packing alignment and facilitates better charge transport between chains and across domains. This mechanism allows the high-crystallinity polymers to help increase the thermal stability of the OSC polymer by blending.

In some embodiments, a third mechanism involves sacrificial preferential oxidation of an isolating polymer. The sacrificial preferential oxidation reduces oxidation of the OSC materials. In some embodiments, the isolating polymer is polyacrylonitrile. In some embodiments, the isolating polymer is polystyrene. In some embodiments, the isolating polymer can be any polymer that oxidizes more readily than the semiconducting polymer and does not produce oxidation products that adversely affect charge transport.

In some embodiments, the oxidation products themselves may be conducting or semiconducting polymers. These may help bridge gaps and transport electrons between OSC polymer chains. In this mechanism, the isolating polymer can be oxidized to a conjugated structure to help increase the thermal stability of an OSC polymer by blending. In some embodiments, an oxidative-induction time (OIT) technique is used to determine which polymer will oxidize preferentially. Oxidative-induction time can be measured using differential scanning calorimetry (DSC) with continuous oxygen flow.

In some embodiments, the isolating polymer is polyacrylonitrile. In some embodiments, blending PAN polymer with one of the OSC polymers shown in structures 3 or 4 produces high device performance. The high device performance is due to the prevention of oxidation of the OSC polymer by air using one of the two possible mechanistic routes for PAN oxidation Path one below shows one possible mechanism for the cyclization of PAN. In the mechanism of path one, the PAN is first cyclized then dehydrogenated. Path two shows another possible mechanism for the cyclization of PAN. In the mechanism of path two, the PAN is first dehydrogenated then cyclized.

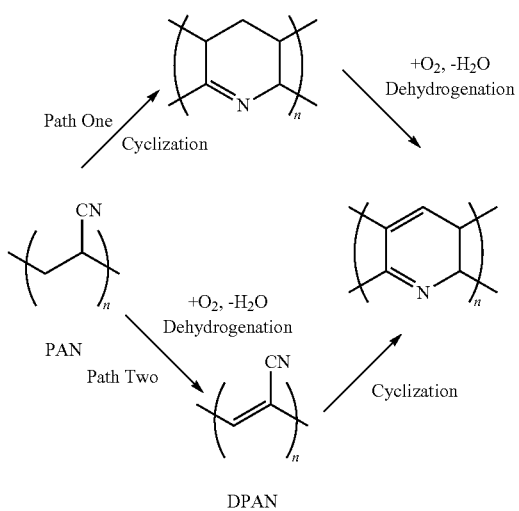

DPAN

IR data of PAN before and after heating at 200° C. for one hour indicate that most of the PAN is converted to this linear conjugated polymer DPAN. This IR data is consistent with solid $^1$H NMR studies.

To further investigate the possible mechanism to prevent or reduce air oxidation of OSC polymers through blending with PAN, both a low molecular weight PAN (Mw=80,000) and the Aldrich PAN (Mw=150,000) were used. The lower molecular weight PAN improved solubility and enabled calculation of a more reliable weight ratio of the OSC polymer to the PAN polymer. This provides an accurate correlation of the weight ratio to the device performance.

In one experiment, the PAN as shown in structures 9 and 10 were used to test the oxidation and cyclization mechanisms. Structure 9 is an alpha substituted PAN, in which R is an alkyl group. Structure 10 is a beta substituted PAN, in which R is an alkyl group. It was determined that both structures 9 and 10 are able to cyclize. Further, because alpha substituted PAN (structure 9) does not have a free hydrogen on the carbon backbones, only beta substituted PAN (structure 10) is able to dehydrogenate on the primary backbone.

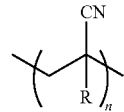

Structure 9

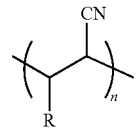

Structure 10

Experimental

To investigate the possible mechanisms, PAN was blended with the OSC polymers shown in structures 3 and 4 in different ratios and the resulting solid mixtures were heated at different temperatures and time periods in air or under nitrogen protection. Solid state NMR, IR spectrometer, and thermogravimetric and differential scanning calorimetry (TG-DSC) studies on them were used to investigate the possible mechanism.

In one experiment, a dialkylated tetrathienoacene copolymer with thiophene was deposited from a dichlorobenzene solution to yield ordered films with a short π-π distance of 3.76 Å, with a field-effect hole mobility that exceeds 0.4 cm$^2$V$^{-1}$s$^{-1}$. An example of a dialkylated tetrathienoacene copolymer with thiophene is shown in Structure 11.

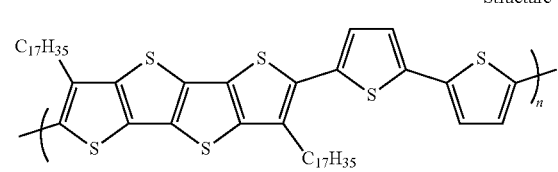

Structure 11

In one experiment, the polymer shown in structure 3 was annealed in various atmospheres at 120° C. and 160° C. Table 1 shows OTFT device performance data for the polymer shown in structure 3. The polymer was cast from 10 mg/mL solution in tetrahydronaphthalene after thermal annealing in different atmospheres at 120° C. and 160° C.

TABLE 1

| Annealing Conditions | Temp. (° C.) | $\mu_h^{ave}$ (cm$^2$V$^{-1}$s$^{-1}$) | $I_{on}/I_{off}^{ave}$ | $V_{Th}^{ave}$ (V) |
|---|---|---|---|---|
| Nitrogen | 120 | 0.16 | ~10$^3$ | −16 |
| Vacuum | 120 | 0.24 | ~10$^5$ | 3 |
| Air | 120 | 0.03 | ~10$^3$ | −16 |
| Nitrogen | 160 | 1.13 | ~10$^7$ | −10 |
| Vacuum | 160 | 0.61 | ~10$^4$ | 3 |
| Air | 160 | 0.07 | ~10$^5$ | −13 |

In another experiment, the polymer shown in structure 4 was annealed in various atmospheres at 120° C. and 160° C.

Table 2 shows OTFT device performance data for the polymer having the structure as shown in structure 4. The polymer was cast from 10 mg/mL solution in tetrahydronaphthalene after thermal annealing in different atmospheres at 120° C. and 160° C.

TABLE 2

| Annealing Conditions | Temp. (° C.) | $\mu_h^{ave}$ (cm$^2$V$^{-1}$s$^{-1}$) | $I_{on}/I_{off}^{ave}$ | $V_{Th}^{ave}$ (V) |
|---|---|---|---|---|
| Nitrogen | 120 | 0.50 | ~10$^4$ | −17 |
| Vacuum | 120 | 0.82 | ~10$^6$ | −17 |
| Air | 120 | 0.22 | ~10$^7$ | −7 |
| Nitrogen | 160 | 1.66 | ~10$^5$ | 3 |
| Vacuum | 160 | 1.98 | ~10$^6$ | −8 |
| Air | 160 | 0.20 | ~10$^4$ | −13 |

In another experiment, the polymer shown in structure 3 was stored in ambient conditions and performance was monitored over time. Table 3 shows OTFT device performance data for the polymer having the structure as shown in structure 3. As shown in Table 3, there was a drop in average mobility over time. FIG. 1 shows a graphical representation of the device performance for the polymer shown in structure 3 after being thermally annealed in nitrogen or air.

TABLE 3

| Age of Device (days) | $\mu_h^{ave}$ (cm$^2$V$^{-1}$s$^{-1}$) | $I_{on}/I_{off}^{ave}$ | $V_{Th}^{ave}$ (V) |
|---|---|---|---|
| 0.125 | 0.40 | ~10$^6$ | 2.0 |
| 0.25 | 0.42 | ~10$^6$ | −6.6 |
| 1 | 0.32 | ~10$^6$ | 0.6 |
| 14 | 0.26 | ~10$^6$ | −6.0 |
| 45 | 0.26 | ~10$^6$ | −12.6 |

In another experiment, the polymer shown in structure 4 was stored in ambient conditions and performance was monitored over time. Table 4 shows OTFT device performance data for the polymer having the structure as shown in structure 4. As shown in Table 4, there was a drop in average mobility over time.

TABLE 4

| Age of Device (days) | $\mu_h^{ave}$ (cm$^2$V$^{-1}$s$^{-1}$) | $I_{on}/I_{off}^{ave}$ | $V_{Th}^{ave}$ (V) |
|---|---|---|---|
| 0.125 | 0.61 | ~10$^4$ | 4.0 |
| 0.25 | 0.54 | ~10$^4$ | 0.6 |
| 1 | 0.59 | ~10$^5$ | −1.4 |
| 14 | 0.52 | ~10$^4$ | −1.6 |
| 45 | 0.44 | ~10$^5$ | 0.2 |

In another experiment, polyacrylonitrile (PAN) was used as the isolating polymer. Polyacrylonitrile was demonstrated to work with other OSC polymers. Table 5 shows device data for various blend ratios of the polymer according to structure 4 with polyacrylonitrile after thermal annealing in air at 160° C. for 10 min. As shown in Table 5, device data reaches a peak between 80:20 and 40:60. Higher ratios of polyacrylonitrile may dilute the semiconducting polymer and reduce the charge transport. Lower ratios of polyacrylonitrile result in device degradation in air at elevated temperatures. As shown in Table 5, at a ratio of 60:40, the OSC device exhibits a significant increase in On/Off ratio and hole mobility compared to a ratio of 100:0, which corresponds to a pure semiconducting polymer. The ratios in Table 5 are weight ratios.

TABLE 5

| C300:PAN ratio | $\mu_h^{ave}$ (cm$^2$V$^{-1}$s$^{-1}$) | $\mu_h^{max}$ (cm$^2$V$^{-1}$s$^{-1}$) | $I_{on}/I_{off}^{ave}$ | $V_{Th}^{ave}$ (V) |
|---|---|---|---|---|
| 100:0 | 0.80 | 0.92 | 4 × 10$^3$ | 6 |
| 80:20 | 0.38 | 0.40 | 3 × 10$^3$ | 1 |
| 60:40 | 1.29 | 1.40 | 4 × 10$^6$ | 3 |
| 40:60 | 0.42 | 0.43 | 9 × 10$^5$ | −1 |
| 20:80 | 0.32 | 0.34 | 2 × 10$^4$ | −10 |

In Tables 3-5, $\mu_h^{ave}$ represents average charge carrier mobility in units of cm$^2$V$^{-1}$s$^{-1}$, $\mu_h^{max}$ represents maximum charge carrier mobility in units of cm$^2$V$^{-1}$s$^{-1}$, $I_{on}/I_{off}^{ave}$ represents average current On/Off ratio, and $V_{Th}^{ave}$ represents threshold voltage in units of Volts.

In another experiment, an organic thin-film transistor (OTFT) was formed with a bottom-gate top-contact configuration, with 100 nm thick gold used as drain/source electrodes. The device had a width of 1000 μm and a length of μm. The substrate comprised a 300 nm thermal grown SiO$_2$/Si with a spin-coated octadecyl-trimethoxylsiline (OTS) treatment. The polymer solution process used o-dichlorobenzene as a solvent at a concentration of 10 mg/mL. The solution was heated at 80° C. overnight. The solution was preheated to 80° C. before spin coating to prevent precipitation of polyacrylonitrile. The spin coating was done by flooding the surface for 1 minute prior to spinning at 1000 rpm for 1 minute. Following the spin coating, thermal annealing was done at a temperature of 120° C. to 160° C. for 10 minutes in experiment specific atmosphere (air, nitrogen, or vacuum). Measurements were taken using a Keithley 2634B two channel semiconductor measurement unit at room temperature and ambient conditions.

As used herein, "polystyrene" includes any reasonable substitutes. "Polystyrene" may include compounds sold commercially as polystyrene, including copolymers and elastomers. Examples of polystyrene may include high impact polystyrene (HIPS), expended polystyrene (EPS), syndiotactic polystyrene (SPS), acrylonitrile-butadiene-styrene copolymers (ABS), styrene-butadiene-styrene block copolymers (SBS), styrene-ethylene-butadiene-styrene block copolymers (SEBS), styrene-acrylonitrile copolymers (SAN), and methyl methacrylate-butadiene-styrene (MBS).

Unless otherwise specified, molecular weights referred to herein are number average molecular weights ($M_n$). The molecular weights referred to herein for organic semiconductor polymers are number average molecular weights determined by gel permeation chromatography (GPC) in 1,2,4-trichlorobenzene at 200° C. with a flow rate of 1 mL/min, and referenced to polystyrene standards. The molecular weights referred to herein for isolating polymers are obtained from packaging or data sheets from the polymer supplier, and may be number average molecular weights or weight average molecular weights ($M_w$). The PDI (polydispersity index, $M_w/M_n$) for the isolating polymers is often close to 1, such that $M_n$ is about equal to $M_w$. So, it is reasonable to refer to the molecular weights of the isolating polymers as number average.

As used herein, a "derivative" of a compound is a similar compound derived from the compound by a chemical reaction.

As used herein, the term "room temperature" is 20-25° C.

The term "alkyl" refers to a monoradical branched or unbranched saturated hydrocarbon chain having 1, 2, 3, 4, 5, 6, 7, 8, 9, 10, 11, 12, 13, 14, 15, 16, 17, 18, 19 or 20 carbon atoms. This term is exemplified by groups such as methyl, ethyl, n-propyl, iso-propyl, n-butyl, iso-butyl, t-butyl, n-hexyl, n-decyl, tetradecyl, and the like.

The term "substituted alkyl" refers to: (1) an alkyl group as defined above, having 1, 2, 3, 4 or 5 substituents, typically 1 to 3 substituents, selected from the group consisting of alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonyl amino, heteroaryloxy, heterocyclyl, heterocyclooxy, hydroxyamino, alkoxyamino, nitro, —SO-alkyl, —SO-aryl, —SO-heteroaryl, —$SO_2$-alkyl, $SO_2$-aryl and —$S_2$-heteroaryl. Unless otherwise constrained by the definition, all substituents may optionally be further substituted by 1, 2, or 3 substituents chosen from alkyl, carboxy, carboxyalkyl, aminocarbonyl, hydroxy, alkoxy, halogen, $CF_3$, amino, substituted amino, cyano, and —$S(O)_nR_{SO}$, where $R_{SO}$ is alkyl, aryl, or heteroaryl and n is 0, 1 or 2; or (2) an alkyl group as defined above that is interrupted by 1-10 atoms independently chosen from oxygen, sulfur and $NR_a$, where $R_a$ is chosen from hydrogen, alkyl, cycloalkyl, alkenyl, cycloalkenyl, alkynyl, aryl, heteroaryl and heterocyclyl. All substituents may be optionally further substituted by alkyl, alkoxy, halogen, $CF_3$, amino, substituted amino, cyano, or —$S(O)_nR_{SO}$, in which $R_{SO}$ is alkyl, aryl, or heteroaryl and n is 0, 1 or 2; or (3) an alkyl group as defined above that has both 1, 2, 3, 4 or 5 substituents as defined above and is also interrupted by 1-10 atoms as defined above.

The term "alkylene" refers to a diradical of a branched or unbranched saturated hydrocarbon chain, having 1, 2, 3, 4, 5, 6, 7, 8, 9, 10, 11, 12, 13, 14, 15, 16, 17, 18, 19 or 20 carbon atoms, typically 1-10 carbon atoms, more typically 1, 2, 3, 4, 5 or 6 carbon atoms. This term is exemplified by groups such as methylene (—$CH_2$—), ethylene (—$CH_2CH_2$—), the propylene isomers (e.g., —$CH_2CH_2CH_2$— and —$CH(CH_3)CH_2$—) and the like.

The term "substituted alkylene" refers to: (1) an alkylene group as defined above having 1, 2, 3, 4, or 5 substituents selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonyl amino, heteroaryloxy, heterocyclyl, heterocyclooxy, hydroxyamino, alkoxyamino, nitro, —SO-alkyl, —SO-aryl, —SO-heteroaryl, —$SO_2$-alkyl, —$SO_2$-aryl and —$SO_2$-heteroaryl. Unless otherwise constrained by the definition, all substituents may optionally be further substituted by 1, 2, or 3 substituents chosen from alkyl, carboxy, carboxyalkyl, aminocarbonyl, hydroxy, alkoxy, halogen, $CF_3$, amino, substituted amino, cyano, and —$S(O)_nR_{SO}$, where $R_{SO}$ is alkyl, aryl, or heteroaryl and n is 0, 1 or 2; or (2) an alkylene group as defined above that is interrupted by 1-20 atoms independently chosen from oxygen, sulfur and $NR_a$—, where $R_a$ is chosen from hydrogen, optionally substituted alkyl, cycloalkyl, cycloalkenyl, aryl, heteroaryl and heterocyclyl, or groups selected from carbonyl, carboxyester, carboxyamide and sulfonyl; or (3) an alkylene group as defined above that has both 1, 2, 3, 4 or 5 substituents as defined above and is also interrupted by 1-20 atoms as defined above. Examples of substituted alkylenes are chloromethylene (—CH(Cl)—), aminoethylene (—CH($NH_2$)$CH_2$—), methylaminoethylene (—CH(NHMe)$CH_2$—), 2-carboxypropylene isomers (—$CH_2$CH($CO_2$H)$CH_2$—), ethoxyethyl (—$CH_2CH_2$O—$CH_2CH_2$—), ethylmethylaminoethyl (—$CH_2CH_2$N($CH_3$)$CH_2CH_2$—), and the like.

The term "aralkyl" refers to an aryl group covalently linked to an alkylene group, where aryl and alkylene are defined herein. "Optionally substituted aralkyl" refers to an optionally substituted aryl group covalently linked to an optionally substituted alkylene group. Such aralkyl groups are exemplified by benzyl, phenylethyl, 3-(4-methoxyphenyl)propyl, and the like.

The term "alkoxy" refers to the group R—O—, where R is an optionally substituted alkyl or optionally substituted cycloalkyl, or R is a group —Y—Z, in which Y is optionally substituted alkylene and Z is optionally substituted alkenyl, optionally substituted alkynyl; or optionally substituted cycloalkenyl, where alkyl, alkenyl, alkynyl, cycloalkyl and cycloalkenyl are as defined herein. Typical alkoxy groups are optionally substituted alkyl-O— and include, by way of example, methoxy, ethoxy, n-propoxy, iso-propoxy, n-butoxy, tert-butoxy, sec-butoxy, n-pentoxy, n-hexoxy, 1,2-dimethylbutoxy, trifluoromethoxy, and the like.

The term "alkylthio" refers to the group $R_S$—S—, where $R_S$ is as defined for alkoxy.

The term "alkenyl" refers to a monoradical of a branched or unbranched unsaturated hydrocarbon group typically having from 2 to 20 carbon atoms, more typically 2 to 10 carbon atoms and even more typically 2 to 6 carbon atoms and having 1-6, typically 1, double bond (vinyl). Typical alkenyl groups include ethenyl or vinyl (—CH=$CH_2$), 1-propylene or allyl (—$CH_2$CH=$CH_2$), isopropylene (—C($CH_3$)=$CH_2$), bicyclo[2.2.1]heptene, and the like. In the event that alkenyl is attached to nitrogen, the double bond cannot be alpha to the nitrogen.

The term "substituted alkenyl" refers to an alkenyl group as defined above having 1, 2, 3, 4 or 5 substituents, and typically 1, 2, or 3 substituents, selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, amino sulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —$SO_2$-alkyl, $SO_2$-aryl and —$SO_2$-heteroaryl. Unless otherwise constrained by the definition, all substituents may optionally be further substituted by 1, 2, or 3 substituents chosen from alkyl, carboxy, carboxyalkyl, aminocarbonyl, hydroxy, alkoxy, halogen, $CF_3$, amino, substituted amino, cyano, and —$S(O)_nR_{SO}$, where $R_{SO}$ is alkyl, aryl, or heteroaryl and n is 0, 1 or 2.

The term "alkynyl" refers to a monoradical of an unsaturated hydrocarbon, typically having from 2 to 20 carbon atoms, more typically 2 to 10 carbon atoms and even more typically 2 to 6 carbon atoms and having at least 1 and typically from 1-6 sites of acetylene (triple bond) unsaturation. Typical alkynyl groups include ethynyl, (—C≡CH), propargyl (or prop-1-yn-3-yl, —$CH_2$C≡CH), and the like. In the event that alkynyl is attached to nitrogen, the triple bond cannot be alpha to the nitrogen.

The term "substituted alkynyl" refers to an alkynyl group as defined above having 1, 2, 3, 4 or 5 substituents, and typically 1, 2, or 3 substituents, selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, amino sulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, SO$_2$-aryl and —SO$_2$-heteroaryl. Unless otherwise constrained by the definition, all substituents may optionally be further substituted by 1, 2, or 3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "aminocarbonyl" refers to the group —C(O)NR$_N$R$_N$ where each R$_N$ is independently hydrogen, alkyl, aryl, heteroaryl, heterocyclyl or where both R$_N$ groups are joined to form a heterocyclic group (e.g., morpholino). Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and –S(O)$_n$R$_{SO}$, where R$_{SO}$ is alkyl, aryl, or heteroaryl and n is 0, 1 or 2.

The term "acylamino" refers to the group —NR$_{NCO}$C(O)R where each R$_{NCO}$ is independently hydrogen, alkyl, aryl, heteroaryl, or heterocyclyl. Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "acyloxy" refers to the groups —O(O)C-alkyl, —O(O)C-cycloalkyl, —O(O)C-aryl, —O(O)C-heteroaryl, and —O(O)C-heterocyclyl. Unless otherwise constrained by the definition, all sub stituents may be optionally further substituted by alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "aryl" refers to an aromatic carbocyclic group of 6 to 20 carbon atoms having a single ring (e.g., phenyl) or multiple rings (e.g., biphenyl), or multiple condensed (fused) rings (e.g., naphthyl or anthryl). Typical aryls include phenyl, naphthyl and the like.

Unless otherwise constrained by the definition for the aryl substituent, such aryl groups can optionally be substituted with from 1 to 5 substituents, typically 1 to 3 substituents, selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, SO$_2$-aryl and —SO$_2$-heteroaryl. Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "aryloxy" refers to the group aryl-O— wherein the aryl group is as defined above, and includes optionally substituted aryl groups as also defined above. The term "arylthio" refers to the group aryl-S—, where aryl is as defined as above.

The term "amino" refers to the group —NH$_2$.

The term "substituted amino" refers to the group —NR$_w$R$_w$ where each R$_w$ is independently selected from the group consisting of hydrogen, alkyl, cycloalkyl, carboxyalkyl (for example, benzyloxycarbonyl), aryl, heteroaryl and heterocyclyl provided that both R$_w$ groups are not hydrogen, or a group —Y—Z, in which Y is optionally substituted alkylene and Z is alkenyl, cycloalkenyl, or alkynyl. Unless otherwise constrained by the definition, all substituents may optionally be further substituted by 1-3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "carboxyalkyl" refers to the groups —C(O)O-alkyl or —C(O)O-cycloalkyl, where alkyl and cycloalkyl, are as defined herein, and may be optionally further substituted by alkyl, alkenyl, alkynyl, alkoxy, halogen, CF$_3$, amino, substituted amino, cyano, and —S(O)$_n$R$_{SO}$, in which R$_{SO}$ is alkyl, aryl, or heteroaryl and n is 0, 1 or 2.

The term "cycloalkyl" refers to carbocyclic groups of from 3 to 20 carbon atoms having a single cyclic ring or multiple condensed rings. Such cycloalkyl groups include, by way of example, single ring structures such as cyclopropyl, cyclobutyl, cyclopentyl, cyclooctyl, and the like, or multiple ring structures such as adamantanyl, bicyclo[2.2.1]heptane, 1,3,3-trimethylbicyclo[2.2.1]hept-2-yl, (2,3,3-trimethylbicyclo[2.2.1]hept-2-yl), or carbocyclic groups to which is fused an aryl group, for example indane, and the like.

The term "cycloalkenyl" refers to carbocyclic groups of from 3 to 20 carbon atoms having a single cyclic ring or multiple condensed rings with at least one double bond in the ring structure.

The terms "substituted cycloalkyl" or "substituted cycloalkenyl" refer to cycloalkyl or cycloalkenyl groups having 1, 2, 3, 4 or 5 substituents, and typically 1, 2, or 3 substituents, selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, aminosulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, SO$_2$-aryl and —SO$_2$-heteroaryl. Unless otherwise constrained by the definition, all substituents may optionally be further substituted by 1, 2, or 3 substituents chosen from alkyl, carboxy, carboxyalkyl, aminocarbonyl, hydroxy, alkoxy, halogen, CF$_3$, amino, substituted amino, cyano, and —S(O)$_n$R$_{SO}$, where R$_{SO}$ is alkyl, aryl, or heteroaryl and n is 0, 1 or 2.

The term "halogen" or "halo" refers to fluoro, bromo, chloro, and iodo.

The term "acyl" denotes a group —C(O)R$_{CO}$, in which R$_{CO}$ is hydrogen, optionally substituted alkyl, optionally substituted cycloalkyl, optionally substituted heterocyclyl, optionally substituted aryl, and optionally substituted heteroaryl.

The term "heteroaryl" refers to a radical derived from an aromatic cyclic group (i.e., fully unsaturated) having 1, 2, 3, 4, 5, 6, 7, 8, 9, 10, 11, 12, 13, 14, or 15 carbon atoms and 1, 2, 3 or 4 heteroatoms selected from oxygen, nitrogen and sulfur within at least one ring. Such heteroaryl groups can have a single ring (e.g., pyridyl or furyl) or multiple condensed rings (e.g., indolizinyl, benzothiazolyl, or benzothienyl). Examples of heteroaryls include, but are not limited to, [1,2,4]oxadiazole, [1,3,4]oxadiazole, [1,2,4]thiadiazole, [1,3,4]thiadiazole, pyrrole, imidazole, pyrazole, pyridine, pyrazine, pyrimidine, pyridazine, indolizine, isoindole, indole, indazole, purine, quinolizine, isoquinoline, quinoline, phthalazine, naphthylpyridine, quinoxaline, quinazoline, cinnoline, pteridine, carbazole, carboline, phenanthridine, acridine, phenanthroline, isothiazole, phenazine, isoxazole, phenoxazine, phenothiazine, imidazolidine, imidazoline, triazole, oxazole, thiazole, naphthyridine, and the like as well as N-oxide and N-alkoxy derivatives of nitrogen containing heteroaryl compounds, for example pyridine-N-oxide derivatives.

Unless otherwise constrained by the definition for the heteroaryl substituent, such heteroaryl groups can be optionally substituted with 1 to 5 substituents, typically 1 to 3 substituents selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, amino sulfonyl, aminocarbonylamino, heteroaryloxy, heterocyclyl, heterocyclooxy, hydroxyamino, alkoxyamino, nitro, —SO-alkyl, —SO-aryl, —SO-heteroaryl, —SO$_2$-alkyl, SO$_2$-aryl and —SO$_2$-heteroaryl. Unless otherwise constrained by the definition, all substituents may optionally be further substituted by 1-3 substituents chosen from alkyl, carboxy, carboxyalkyl, aminocarbonyl, hydroxy, alkoxy, halogen, $CF_3$, amino, substituted amino, cyano, and —S(O)$_n$R$_{SO}$, where R$_{SO}$ is alkyl, aryl, or heteroaryl and n is 0, 1 or 2.

The term "heteroaralkyl" refers to a heteroaryl group covalently linked to an alkylene group, where heteroaryl and alkylene are defined herein. "Optionally substituted heteroaralkyl" refers to an optionally substituted heteroaryl group covalently linked to an optionally substituted alkylene group. Such heteroaralkyl groups are exemplified by 3-pyridylmethyl, quinolin-8-ylethyl, 4-methoxythiazol-2-ylpropyl, and the like.

The term "heteroaryloxy" refers to the group heteroaryl-O—.

The term "heterocyclyl" refers to a monoradical saturated or partially unsaturated group having a single ring or multiple condensed rings, having from 1 to 40 carbon atoms and from 1 to 10 hetero atoms, typically 1, 2, 3 or 4 heteroatoms, selected from nitrogen, sulfur, phosphorus, and/or oxygen within the ring. Heterocyclic groups can have a single ring or multiple condensed rings, and include tetrahydrofuranyl, morpholino, piperidinyl, piperazino, dihydropyridino, and the like.

Unless otherwise constrained by the definition for the heterocyclyl substituent, such heterocyclyl groups can be optionally substituted with 1, 2, 3, 4 or 5, and typically 1, 2 or 3 substituents, selected from the group consisting of alkyl, alkenyl, alkynyl, alkoxy, cycloalkyl, cycloalkenyl, acyl, acylamino, acyloxy, amino, aminocarbonyl, alkoxycarbonylamino, azido, cyano, halogen, hydroxy, keto, thiocarbonyl, carboxy, carboxyalkyl, arylthio, heteroarylthio, heterocyclylthio, thiol, alkylthio, aryl, aryloxy, heteroaryl, amino sulfonyl, aminocarbonylamino, heteroaryloxy, heterocyclyl, heterocyclooxy, hydroxyamino, alkoxyamino, nitro, —SO-alkyl, —SO-aryl, —SO-hetero aryl, —SO$_2$-alkyl, —SO$_2$-aryl and —SO$_2$-hetero aryl. Unless otherwise constrained by the definition, all substituents may optionally be further substituted by 1-3 substituents chosen from alkyl, carboxy, carboxyalkyl, aminocarbonyl, hydroxy, alkoxy, halogen, $CF_3$, amino, substituted amino, cyano, and —S(O)$_n$R$_{SO}$, where R$_{SO}$ is alkyl, aryl, or heteroaryl and n is 0, 1 or 2.

The term "thiol" refers to the group —SH.

The term "substituted alkylthio" refers to the group —S-substituted alkyl.

The term "heteroarylthiol" refers to the group —S-heteroaryl wherein the heteroaryl group is as defined above including optionally substituted heteroaryl groups as also defined above.

The term "sulfoxide" refers to a group —S(O)R$_{SO}$, in which R$_{SO}$ is alkyl, aryl, or heteroaryl. "Substituted sulfoxide" refers to a group —S(O)R$_{SO}$, in which R$_{SO}$ is substituted alkyl, substituted aryl, or substituted heteroaryl, as defined herein.

The term "sulfone" refers to a group —S(O)$_2$R$_{SO}$, in which R$_{SO}$ is alkyl, aryl, or heteroaryl. "Substituted sulfone" refers to a group —S(O)$_2$R$_{SO}$, in which R$_{SO}$ is substituted alkyl, substituted aryl, or substituted heteroaryl, as defined herein.

The term "keto" refers to a group —C(O)—.

The term "thiocarbonyl" refers to a group —C(S)—.

The term "carboxy" refers to a group —C(O)OH.

The term "conjugated group" is defined as a linear, branched or cyclic group, or combination thereof, in which p-orbitals of the atoms within the group are connected via delocalization of electrons and wherein the structure can be described as containing alternating single and double or triple bonds and may further contain lone pairs, radicals, or carbenium ions. Conjugated cyclic groups may comprise both aromatic and non-aromatic groups, and may comprise polycyclic or heterocyclic groups, such as diketopyrrolopyrrole. Ideally, conjugated groups are bound in such a way as to continue the conjugation between the thiophene moieties they connect.

The term "or," as used herein, is inclusive; more specifically, the phrase "A or B" means "A, B, or both A and B." Exclusive "or" is designated herein by terms such as "either A or B" and "one of A or B," for example. The indefinite articles "a" and "an" and the definite article "the" to describe an element or component means that one or at least one of these elements or components is present, unless otherwise stated in specific instances.

Where a range of numerical values is recited herein, comprising upper and lower values, unless otherwise stated in specific circumstances, the range is intended to include the endpoints thereof, and all integers and fractions within the range. It is not intended that the scope of the claims be limited to the specific values recited when defining a range. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. Finally, when the term "about" is used in describing a value or an end-point of a range, the disclosure should be understood to include the specific value or end-point referred to. Regardless of whether a numerical value or end-point of a range recites "about," the numerical value or end-point of a range is intended to include two embodiments: one modified by "about," and one not modified by "about."

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about."

The term "wherein" is used as an open-ended transitional phrase, to introduce a recitation of a series of characteristics of the structure.

As used herein, "comprising" is an open-ended transitional phrase. A list of elements following the transitional phrase "comprising" is a non-exclusive list, such that elements in addition to those specifically recited in the list may also be present.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of such teachings and guidance.

The breadth and scope of the present disclosure should not be limited by any of the above-described exemplary embodiments, but should be defined only in accordance with the following claims and their equivalents.

What is claimed is:

1. A polymer blend, comprising:
an organic semiconductor polymer blended with an isolating polymer;
wherein the organic semiconductor polymer is a diketopyrrolopyrrole fused thiophene polymeric material, wherein the fused thiophene is beta-substituted,
wherein the isolating polymer has a non-conjugated backbone, and
wherein the isolating polymer is selected from the group consisting of:
polyacrylonitrile, alkyl substituted polyacrylonitrile, polystyrene, polysulfonate, polycarbonate, an elastomer block copolymer, derivatives thereof, copolymers thereof and mixtures thereof,
wherein the organic semiconductor polymer comprises the repeat unit of formula 1' or 2'

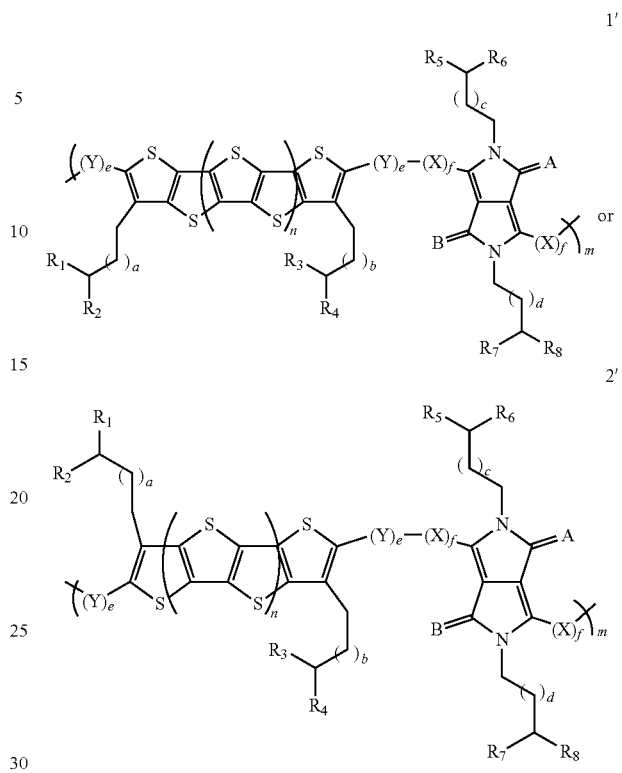

wherein, in the structure 1' and 2', m is an integer greater than or equal to one; n is 0, 1, or 2; $R_1$, $R_2$, $R_3$, $R_4$, $R_5$, $R_6$, $R_7$, and $R_8$, may be, independently, hydrogen, substituted or unsubstituted $C_4$ or greater alkyl, substituted or unsubstituted $C_4$ or greater alkenyl, substituted or unsubstituted $C_4$ or greater alkynyl, or $C_5$ or greater cycloalkyl; a, b, c, and d are independently, integers greater than or equal to 3; e and f are integers greater than or equal to zero; X and Y are, independently a covalent bond, an optionally substituted aryl group, an optionally substituted heteroaryl, an optionally substituted fused aryl or fused heteroaryl group, an alkyne or an alkene; and A and B may be, independently, either S or O, with the provisos that:
i. at least one of $R_1$ or $R_2$; one of $R_3$ or $R_4$; one of $R_5$ or $R_6$; and one of $R_7$ or $R_8$ is a substituted or unsubstituted alkyl, substituted or unsubstituted alkenyl, substituted or unsubstituted alkynyl, or cycloalkyl;
ii. if any of $R_1$, $R_2$, $R_3$, or $R_4$ is hydrogen, then none of $R_5$, $R_6$, $R_7$, or $R_8$ are hydrogen;
iii. if any of $R_5$, $R_6$, $R_7$, or $R_8$ is hydrogen, then none of $R_1$, $R_2$, $R_3$, or $R_4$ are hydrogen;
iv. e and f cannot both be 0;
v. if either e or f is 0, then c and d, independently, are integers greater than or equal to 5; and
vi. the polymer having a molecular weight, wherein the molecular weight of the polymer is greater than 10,000.

2. The polymer blend of claim 1, wherein the isolating polymer is polystyrene and derivatives thereof.

3. The polymer blend of claim 2, wherein the polystyrene has a number average molecular weight of greater than 5,000.

4. The polymer blend of claim 2, wherein the polystyrene has a number average molecular weight of greater than 10,000.

5. The polymer blend of claim 1, wherein the isolating polymer forms an encapsulating layer between the organic semiconductor and an air interface.

6. The polymer blend of claim 1, wherein the isolating polymer oxidizes preferentially to the organic semiconductor polymer.

7. The polymer blend of claim 6, wherein the isolating polymer that oxidizes preferentially to the organic semiconductor polymer is polyacrylonitrile, alkyl substituted polyacrylonitrile, or copolymers thereof.

8. The polymer blend of claim 1, wherein the weight ratio of organic semiconductor polymer to isolating polymer in the blend is between 95:5 and 5:95.

9. The polymer blend of claim 8, wherein the weight ratio of organic semiconductor polymer to isolating polymer in the blend is between 80:20 and 40:60.

10. The polymer blend of claim 8, wherein the weight ratio of organic semiconductor polymer to isolating polymer in the blend is between 55:45 and 65:35.

11. A method of fabricating an organic semiconductor device, comprising:
   blending an organic semiconductor polymer with an isolating polymer in an organic solvent to create a polymer blend; and
   depositing a thin film of the polymer blend over a substrate;
   wherein:
   the organic semiconductor polymer is a diketopyrrolopyrrole fused thiophene polymeric material, wherein the fused thiophene is beta-substituted,
   isolating polymer has a non-conjugated backbone, and
   the non-conjugated polymer is selected from the group consisting of: polyacrylonitrile, alkyl substituted polyacrylonitrile, polystyrene, polysulfonate, polycarbonate, an elastomer block copolymer, derivatives thereof, copolymers thereof and mixtures thereof,
   wherein the organic semiconductor polymer comprises the repeat unit of formula 1' or 2'

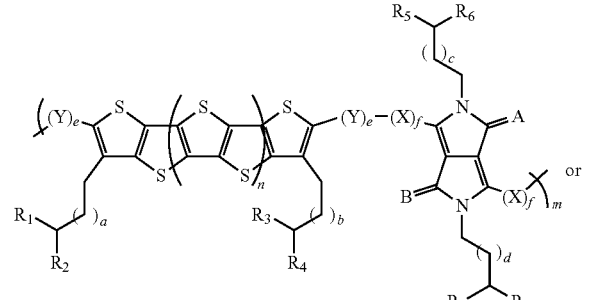

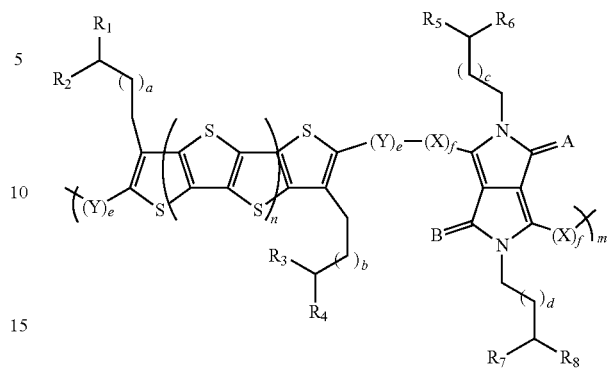

wherein, in the structure 1' and 2', m is an integer greater than or equal to one; n is 0, 1, or 2; $R_1$, $R_2$, $R_3$, $R_4$, $R_5$, $R_6$, $R_7$, and $R_8$, may be, independently, hydrogen, substituted or unsubstituted $C_4$ or greater alkyl, substituted or unsubstituted $C_4$ or greater alkenyl, substituted or unsubstituted $C_4$ or greater alkynyl, or $C_5$ or greater cycloalkyl; a, b, c, and d are independently, integers greater than or equal to 3; e and f are integers greater than or equal to zero; X and Y are, independently a covalent bond, an optionally substituted aryl group, an optionally substituted heteroaryl, an optionally substituted fused aryl or fused heteroaryl group, an alkyne or an alkene; and A and B may be, independently, either S or O, with the provisos that:
   i. at least one of $R_1$ or $R_2$; one of $R_3$ or $R_4$; one of $R_5$ or $R_6$; and one of $R_7$ or $R_8$ is a substituted or unsubstituted alkyl, substituted or unsubstituted alkenyl, substituted or unsubstituted alkynyl, or cycloalkyl;
   ii. if any of $R_1$, $R_2$, $R_3$, or $R_4$ is hydrogen, then none of $R_5$, $R_6$, $R_7$, or $R_8$ are hydrogen;
   iii. if any of $R_5$, $R_6$, $R_7$, or $R_8$ is hydrogen, then none of $R_1$, $R_2$, $R_3$, or $R_4$ are hydrogen;
   iv. e and f cannot both be 0;
   v. if either e or f is 0, then c and d, independently, are integers greater than or equal to 5; and
   vi. the polymer having a molecular weight, wherein the molecular weight of the polymer is greater than 10,000.

12. The method of claim 11, further comprising thermally annealing the thin film after the thin film is deposited over the substrate.

13. The method of claim 12, wherein the annealing step is performed at a temperature of 100° C. to 180° C.

14. The method of claim 11, wherein the thin film is annealed in air.

15. The method of claim 11, wherein the isolating polymer is polystyrene and derivatives thereof.

16. The method of claim 15, wherein the polystyrene has a number average molecular weight of greater than 5,000.

17. The method of claim 15, wherein the polystyrene has a number average molecular weight of greater than 10,000.

18. The method of claim 11, wherein the organic solvent is a non-halogenated solvent.

19. The method of claim 18, wherein the non-halogenated solvent is selected from the group consisting of: m-xylene, o-xylene, p-xylene, toluene, tetralin, cis-decalin, trans-decalin, mesitylene, cyclooctane, and bicyclohexyl, and mixtures thereof.

20. The method of claim 11, wherein blending an organic semiconductor polymer with an isolating polymer in an organic solvent to create a polymer blend is performed at a temperature greater than 70° C.

21. The method of claim 11, wherein the organic semiconductor polymer and the isolating polymer each have a solubility of 1 mg/mL or more in the non-halogenated solvent at room temperature.

22. An organic semiconductor device, comprising:
a thin semiconducting film, the thin semiconducting film comprising:
a polymer blend, the polymer blend comprising:
an organic semiconductor polymer blended with an isolating polymer;
wherein the organic semiconductor polymer is a diketopyrrolopyrrole fused thiophene polymeric material, wherein the fused thiophene is beta-substituted, and
wherein the isolating polymer is selected from the group consisting of: polyacrylonitrile, alkyl substituted polyacrylonitrile, polystyrene, polysulfonate, polycarbonate, an elastomer block copolymer, derivatives thereof, copolymers thereof and mixtures thereof
wherein the organic semiconductor polymer comprises the repeat unit of formula 1' or 2'

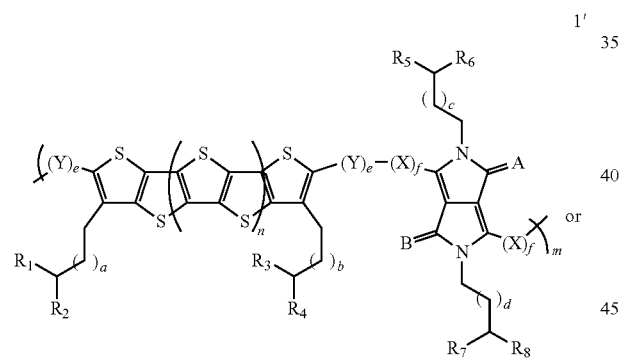

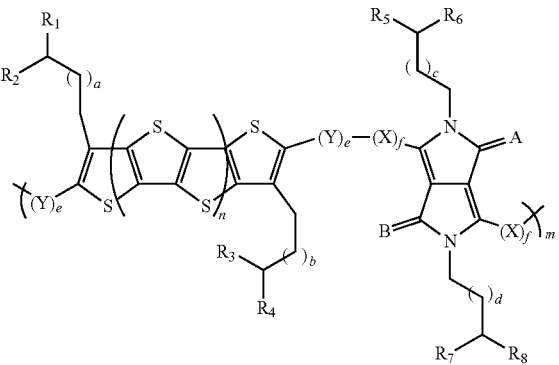

wherein, in the structure 1' and 2', m is an integer greater than or equal to one; n is 0, 1, or 2; $R_1$, $R_2$, $R_3$, $R_4$, $R_5$, $R_6$, $R_7$, and $R_8$, may be, independently, hydrogen, substituted or unsubstituted $C_4$ or greater alkyl, substituted or unsubstituted $C_4$ or greater alkenyl, substituted or unsubstituted $C_4$ or greater alkynyl, or $C_5$ or greater cycloalkyl; a, b, c, and d are independently, integers greater than or equal to 3; e and f are integers greater than or equal to zero; X and Y are, independently a covalent bond, an optionally substituted aryl group, an optionally substituted heteroaryl, an optionally substituted fused aryl or fused heteroaryl group, an alkyne or an alkene; and A and B may be, independently, either S or O, with the provisos that:
  i. at least one of $R_1$ or $R_2$; one of $R_3$ or $R_4$; one of $R_5$ or $R_6$; and one of $R_7$ or $R_8$ is a substituted or unsubstituted alkyl, substituted or unsubstituted alkenyl, substituted or unsubstituted alkynyl, or cycloalkyl;
  ii. if any of $R_1$, $R_2$, $R_3$, or $R_4$ is hydrogen, then none of $R_5$, $R_6$, $R_7$, or $R_8$ are hydrogen;
  iii. if any of $R_5$, $R_6$, $R_7$, or $R_8$ is hydrogen, then none of $R_1$, $R_2$, $R_3$, or $R_4$ are hydrogen;
  iv. e and f cannot both be 0;
  v. if either e or f is 0, then c and d, independently, are integers greater than or equal to 5; and
  vi. the polymer having a molecular weight, wherein the molecular weight of the polymer is greater than 10,000.

* * * * *

UNITED STATES PATENT AND TRADEMARK OFFICE
CERTIFICATE OF CORRECTION

PATENT NO. : 11,283,023 B2
APPLICATION NO. : 16/620050
DATED : March 22, 2022
INVENTOR(S) : He et al.

It is certified that error appears in the above-identified patent and that said Letters Patent is hereby corrected as shown below:

On the Title Page

On the page 3, in Column 1, item (56) under "Other Publications", Line 5, delete "Hihg-" and insert -- High- --.

On the page 3, in Column 1, item (56) under "Other Publications", Line 10, delete "Advnaces" and insert -- Advances --.

On the page 3, in Column 1, item (56) under "Other Publications", Line 15, delete "Molefule/" and insert -- Molecule/ --.

On the page 3, in Column 1, item (56) under "Other Publications", Line 17, delete "Funcional" and insert -- Functional --.

On the page 3, in Column 1, item (56) under "Other Publications", Line 24, delete "Advnaced" and insert -- Advanced --.

On the page 3, in Column 2, item (56) under "Other Publications", Line 18, delete "Thienothiphene" and insert -- Thienothiophene --.

On the page 3, in Column 2, item (56) under "Other Publications", Line 49, delete "Advanecd" and insert -- Advanced --.

On the page 3, in Column 2, item (56) under "Other Publications", Line 59, delete "Appliws" and insert -- Applied --.

On the page 4, in Column 1, item (56) under "Other Publications", Line 20, delete ""Scalabel" and insert -- "Scalable --.

On the page 4, in Column 2, item (56) under "Other Publications", Line 20, delete "Buliding" and Signed and Sealed this
Twenty-seventh Day of September, 2022

Katherine Kelly Vidal
*Director of the United States Patent and Trademark Office* insert -- Building --.

On the page 4, in Column 2, item (56) under "Other Publications", Line 30, delete "Properites" and insert -- Properties --.